(12) United States Patent
Van Winkelhoff et al.

(10) Patent No.: US 9,696,772 B2
(45) Date of Patent: Jul. 4, 2017

(54) CONTROLLING ACCESS TO A MEMORY

(71) Applicant: ARM LIMITED, Cambridge (GB)

(72) Inventors: Nicolaas Klarinus Johannes Van Winkelhoff, Grenoble (FR); Ali Alaoui, Cambridge (FR)

(73) Assignee: ARM Limited, Cambridge (GB)

( * ) Notice: Subject to any disclaimer, the term of this patent is extended or adjusted under 35 U.S.C. 154(b) by 593 days.

(21) Appl. No.: 14/186,519

(22) Filed: Feb. 21, 2014

(65) Prior Publication Data
US 2015/0242331 A1   Aug. 27, 2015

(51) Int. Cl.
*G06F 1/24*     (2006.01)
*G11C 7/20*    (2006.01)
*G11C 7/24*    (2006.01)

(52) U.S. Cl.
CPC ............... *G06F 1/24* (2013.01); *G11C 7/20* (2013.01); *G11C 7/24* (2013.01)

(58) Field of Classification Search
CPC ............... G06F 1/24; G11C 7/20; G11C 7/24
See application file for complete search history.

(56) References Cited

U.S. PATENT DOCUMENTS

| | | | | |
|---|---|---|---|---|
| 4,083,052 A * | 4/1978 | Metcalf | ...................... | G07C 5/12 |
| | | | | 324/171 |
| 4,507,683 A * | 3/1985 | Griesshaber | ......... | H04N 17/002 |
| | | | | 340/524 |
| 4,589,099 A * | 5/1986 | Laffitte | ...................... | G11C 7/10 |
| | | | | 365/189.07 |
| 5,406,261 A | 4/1995 | Glenn | | |
| 5,535,409 A | 7/1996 | Larvoire et al. | | |
| 5,940,606 A * | 8/1999 | Ghia | ...................... | G06F 1/025 |
| | | | | 711/100 |
| 6,111,441 A * | 8/2000 | Hartley | ................ | H03K 17/223 |
| | | | | 327/143 |
| 6,157,204 A * | 12/2000 | Sher | ...................... | H03K 17/163 |
| | | | | 326/17 |
| 6,300,788 B1 * | 10/2001 | Sher | ...................... | H03K 17/163 |
| | | | | 326/17 |

(Continued)

OTHER PUBLICATIONS

Lawrence Goetz, "Sequential Logic", Jun. 26, 2007, pp. 1-4, https://web.archive.org/web/20070626101014/http://www.sci.brooklyn.cuny.edu/~goetz/projects/logic/seq.html.*

*Primary Examiner* — Christopher D Birkhimer
(74) *Attorney, Agent, or Firm* — Pramudji Law Group PLLC; Ari Pramudji

(57) ABSTRACT

A memory protection device for controlling access to a memory and a method of controlling access to a memory are disclosed. A memory status value held by latch circuitry in the memory protection device determines whether the memory is an enabled or a disabled state. After power-up, a power-on-reset signal causes the memory status value to indicate the enabled state. In response to the assertion from a received control signal a memory kill signal is generated by the memory protection device which causes the memory status value to switch to its disabled state and the memory status value then cannot be changed back to the enabled state without a power reset. The memory status value being in the disabled state causes enable signal generation circuitry of the memory to openly be able to generate its read enable signal and write enable signal in a disabled state, thus preventing access to the memory.

19 Claims, 18 Drawing Sheets

(56) References Cited

U.S. PATENT DOCUMENTS

| | | | |
|---|---|---|---|
| 6,504,396 B2* | 1/2003 | Sher | H03K 17/163 326/17 |
| 7,213,188 B2* | 5/2007 | Louie | G11C 29/46 714/724 |
| 7,688,646 B2* | 3/2010 | Kang | G11C 14/00 365/189.05 |
| 7,872,582 B1 | 1/2011 | Diorio | |
| 8,176,281 B2* | 5/2012 | Khan | G01R 31/31719 711/163 |
| 2001/0037438 A1 | 11/2001 | Mathis | |
| 2002/0030511 A1* | 3/2002 | Sher | H03K 17/163 326/87 |
| 2002/0054516 A1 | 5/2002 | Taruishi et al. | |
| 2009/0063799 A1 | 3/2009 | Berenbaum et al. | |
| 2009/0113114 A1 | 4/2009 | Berenbaum et al. | |
| 2009/0190430 A1* | 7/2009 | Kang | G11C 14/00 365/233.5 |
| 2010/0122054 A1 | 5/2010 | Mardiks et al. | |
| 2010/0232250 A1 | 9/2010 | Bull et al. | |

* cited by examiner

CONTROLLING ACCESS TO A MEMORY

BACKGROUND OF THE INVENTION

Field of the Invention

The present invention relates to data processing. More particularly, this invention relates to controlling access to a memory.

Description of the Prior Art

It is known that certain data stored in a memory may need careful protection. For example, where the memory is provided as part of a smartcard, the data which the smartcard holds may include credit card details and/or encryption keys which it is important to keep hidden from unauthorised access. One approach to protecting such secure content is to erase the data once it is no longer needed, but this has the disadvantage that it can take a long time to erase all the data. Moreover, the power consumption associated with this full erase process can on the one hand be a disadvantage (for example in a mobile context) and furthermore can in itself represent a security weakness in that aspects of this process can be detectable outside the chip via the peripheral pins and may enable a hacker to derive information related to the secure data being erased. For example this may be due to the fact that the power consumption signature differs in dependence on the previous value held by each bit cell of an on-chip memory.

Other known techniques, such as that disclosed by US patent application publication 2009/0063799, have provided mechanisms for protecting a particular region of memory in which access to the particular region of memory may be initially allowed (for example during initialisation of the system), but thereafter any data read out from that address region is blocked by a masking function to prevent the data from reaching the outside. Accordingly, this technique remains vulnerable to the above mentioned power analysis attacks, both in terms of the power consumption signature when the data is read (since the reading of the data is carried out as normal, but only the provision of the read data values to the outside is blocked) and in terms of its vulnerability to power consumption analysis attacks resulting from writing data to the memory and deducing the previous value of the stored data from the power consumption signature.

Moreover, various existing techniques for protecting the content of a memory are either relatively slow or require relatively large areas to be sacrificed for their circuitry.

Accordingly, it would be desirable to provide an improved technique for protecting the content of a memory which addresses the above mentioned drawbacks of the prior art.

SUMMARY OF THE INVENTION

Viewed from a first aspect, the present invention provides a memory protection device for controlling access to a memory comprising:

latch circuitry configured to hold a memory status value, the memory status value indicative of whether the memory is in an enabled state or in a disabled state, wherein the latch circuitry is configured to be reset on power-up when a power-on-reset signal is asserted and is configured such that, following the reset of the latch circuitry, the memory status value indicates the enabled state;

control circuitry configured, in response to assertion of a received control signal, to assert a memory kill signal, wherein the latch circuitry is configured to switch the memory status value to indicate the disabled state in response to assertion of the memory kill signal and the latch circuitry is configured such that after the memory status value is switched to indicate the disabled state the memory status value cannot be changed to the enabled state without power resetting the memory protection device, and wherein after power resetting the power-on-reset signal is asserted; and disabling circuitry coupled to enable signal circuitry of the memory and configured such that an enable signal provided by the enable signal circuitry can only be provided in a disabled state when the memory status value held by the control circuitry is in the disabled state.

The present techniques provide an advantageously powerful, yet not overly complex, technique for reliably preventing access to the content of the memory once the received control signal has been asserted. The provision of the latch circuitry ensures that once the received control signal has been asserted, the memory status value held by the latch circuitry can only be in the disabled state and thus in turn, by the provision of the disabling circuitry, the enable signal provided by the enable signal generation circuitry can also only be generated in a disabled state. The only way to reset the latch circuitry (this resetting the memory status value to its enabled state) and thus stop the disabling circuitry from preventing the enable signal circuitry of the memory from only being able to provide its enable signal in the disabled state is to perform a power reset (i.e. a power reboot) which deletes the content of the memory. The power-up process following the reboot causes the latch circuitry to be reset and the memory status value to be put into the enabled state.

Furthermore, when the memory is in its disabled state whilst a normal read or write operation cannot be carried out, various aspects of the memory continue to behave normally (e.g. the CLK—clock and GWEN—global write enable, etc.). In some embodiments the CEN—clock enable signal may also behave normally. This adds secrecy to the operation of the memory and adds difficulty for the hacker seeking to determine the internal operation and content of the memory. Also by disabling the read and write operation of the memory at the deep level of the enable signal circuitry, an effective defence is provided against so called "side channel attacks" in which the hacker monitors the current consumption of the chip. For example by seeking to perform read operations, even if the data requested is not passed to the outside, if the read operation at the level of the bit cells is nevertheless carried out (as is the case is some prior art protection techniques) the hacker may be able to derive information about the content of those bits cells only from the corresponding variation in the current consumption of the chip. Similarly, if the hacker is able to perform write operations, he may be able to observe the current consumption of the chip and deduce the previous values of the bit cells, due to variation in the current consumption in dependence on whether the write operation causes a change to the content of a bit cell or not.

Further, the components of the memory protection device can be provided in a relatively constructionally simple manner meaning that the device can have a very small on-chip footprint making it very hard to detect. This represents another line of defence against hacking. Also, with only a relatively small footprint, this device can be implemented in existing memories, without requiring significant disruption to their design. Moreover, the relatively simple construction of the components of the memory protection device mean that it has a low current consumption (for example in embodiments simulated by the inventors, average current consumption has been found to be in the single digits nanoAmps). Finally the chain of logic between the received control signal and the disabling circuitry is relatively simple, meaning that the memory content can be protected quickly following the assertion of the received control signal, and the particular mechanism of protecting that content (namely forcing the enable signal circuitry to only be able to provide the enable signal in the disabled state) further supports this fast implementation of the protection once the received control signal is asserted.

The enable signal circuitry may take a number of forms and be configured to provide a number of different types of enable signal, as long as providing the enable signal in a disabled state fully prevents access to the memory. For example in some embodiments the enable signal circuitry is configured to provide a read enable signal and a write enable signal to the memory and the disabling circuitry is configured such that the read enable signal and the write enable signal provided by the enable signal circuitry can only be provided in a disabled state when the memory status value held by the control circuitry is in the disabled state. This embodiments is applicable to memories which are generally both readable and writeable (examples being SRAM, DRAM, and so on) and the intervention of the disable circuitry to ensure that the read enable signal and the write enable signal can only be provided in a disabled state when the memory status value held by the control circuitry is in the disabled state provides a powerful, deep-rooted mechanism for preventing either read or write access to such a memory.

In some embodiments a write enable signal may not be applicable to the memory, such as in the case of a ROM memory, and in such cases the enable signal circuitry may be configured to provide a clock enable signal to the memory and the disabling circuitry is configured such that the clock enable signal provided by the enable signal circuitry can only be provided in a disabled state when the memory status value held by the control circuitry is in the disabled state.

Accordingly read access to the ROM memory can be prevented when the memory status value held by the control circuitry is in the disabled state. Indeed these two preceding embodiments could be combined, such that the read enable signal, the write enable signal and the clock enable signal are all forced to a disabled state, but where read and write enable signals are used in the memory, forcing these alone to the disabled state is sufficient to prevent all data access to the memory, and it is perceived by the inventors as advantageous if as much as possible of the rest of the memory continues to behave as normally as possible, to hide this access prevention state from external view to as great an extent as can be achieved, and for this reason this combination of embodiments may not be preferred.

The memory protection device makes use of a power-on-reset signal to reset the latch circuitry on power-up and it may be the case that such power-on-reset circuitry configured to generate such a power-on-reset signal is already provided as part of the data processing system of which the memory protection device and memory are configured to form part. However, in some embodiments the memory protection device further comprises power-on-reset circuitry configured to generate the power-on-reset signal when the memory protection device powers up. Improved protection against hacking is enabled by providing the power-on-reset circuitry as part of the memory protection device itself. Power-on-reset circuitry which is provided elsewhere on-chip (or even off-chip) will generally be more vulnerable to hacking attack. This is because such power-on-reset circuitry is generally more accessible, may even be resettable via peripheral pin access and the power-on-reset signal generated by such power-on-reset circuitry (i.e. when not forming part of the memory protection device) will typically be used in many locations on-chip, making it easier for the hacker to access one of these and to force the value of the power-on-reset signal as part of a hacking attack.

The power-on-reset circuitry could be provided in a variety of ways, but in some embodiments the power-on-reset circuitry comprises a voltage divider arranged between a power voltage supply and a ground voltage supply, the voltage divider comprising two self-coupled transistors forming diodes and further comprises a feedback path coupling the power-on-reset signal to a gate of a transistor on a ground supply side of the voltage divider, such that as the power voltage supply rises when the memory protection device powers up the power-on-reset signal is held not-asserted until the power supply voltage reaches a predetermined voltage level and thereafter the power-on-reset signal is held asserted.

An important feature of the power-on-reset circuitry is its behaviour at low (significantly below nominal) voltage. When the voltage supply of the system has reached its nominal value, the power-on-reset signal can be reliably generated (in its asserted state), but given the security context of the present techniques, it is important that as the power supply ramps up (or indeed if a hacker were to artificially reduce the voltage supply back down) that the power-on-reset signal is generated in an orderly, well-defined manner and in particular makes a clean transition from not being asserted (when the voltage supply is too low) to being asserted when the voltage supply has reached a minimum reliable level for this purpose. These characteristics are in part achieved without the power-on-reset circuitry consuming a large amount of area, by virtue of the provision of a voltage divider which comprises two self-coupled transistors forming diodes. Whilst using resistors to provide the two halves of the voltage divider would have provided operationally very reliable components, especially at low voltages, their undesirably large size makes their use inappropriate in the present context. Although transistors generally have a more unpredictable behaviour in a low voltage regime, the configuration of the voltage divider using self-coupled transistors forming diodes means that these components will to a large extent approximate resistor behaviour at these low voltages. Moreover the fast turn-on behaviour of a diode further supports the requirement for a clear switching behaviour of the power-on-reset circuitry as the voltage supply ramps up (or indeed is brought down by a hacker). The second significant aspect of the power-on-rest circuitry is the feedback path which couples the power-on-reset signal to a gate of a transistor on a ground supply side of the voltage divider. This feedback path thus causes the mid-point of the voltage divider to be clamped down whilst the power voltage supply is below the predetermined voltage level and conversely holds the mid-point high once the power supply voltage has exceeded the predetermined voltage level. The required well defined switching behaviour is thus provided.

The disabling circuitry may be configured in a variety of ways but in some embodiments the disabling circuitry comprises a first transistor configured to couple an output of the read enable signal to a predetermined voltage in response to assertion of the memory kill signal, and a second transistor configured to couple an output of the write enable signal to the predetermined voltage when the memory status value held by the control circuitry is in the disabled state. The coupling of the output of the read enable signal and the write enable signal to the predetermined voltage in this manner provides a strongly reliable mechanism, by appropriate selection of the predetermined voltage, for ensuring that the read enable signal and write enable signal cannot be asserted when the memory status value held by the control circuitry is in the disabled state. For example the first and second transistors may be configured to couple the output of the read and write enable signal to a ground supply voltage (to tie these values low), but the inverse configuration where these signals are disabled by being tied high (e.g. by being coupled to a supply voltage such as VDD) is equally contemplated, depending on the definition of "active/enabled" and "inactive/disabled" with respect to particular voltage levels in the embodiment in question.

In some embodiments the disabling circuitry comprises a transistor configured to couple an output of the clock enable signal to a predetermined voltage when the memory status value held by the control circuitry is in the disabled state. Similarly to the previous example, this transistor may be configured to couple the output of the clock enable signal to a ground supply voltage (to tie this value low), but the inverse configuration where this signal is disabled by being tied high (e.g. by being coupled to a supply voltage such as VDD) is equally contemplated.

The latch circuitry may comprise a pair of cross-coupled inverters. Coupling the output of each inverter to the input of the other provides a constructional simple, with correspondingly small footprint, mechanism for providing the latch functionality.

In some such embodiments, each inverter of the pair of cross-coupled inverters comprises a PMOS transistor and an NMOS transistor, wherein in one inverter the PMOS transistor is smaller than the NMOS transistor, whilst in the other inverter the PMOS transistor is larger than the NMOS transistor, such that after power resetting the memory status value indicates the enabled state. The normal constructional arrangement of an inverter which comprises a PMOS transistor and an NMOS transistor is such that the PMOS transistor is larger than the NMOS transistor. However, providing one of the inverters configured such that the PMOS transistor is smaller than the NMOS transistor provides an intentional imbalance to the latch circuitry to which its sensitivity is most pronounced at low voltages (i.e. in the early part of a power-up). This then causes the latch circuitry to tend to take on a particular value during power-up and in particular can be configured such that after power resetting the memory status value indicates the enabled state.

In some embodiments the memory status value is held at a first connection point between the pair of inverters and an inverse value of the memory status value is held at a second connection point between the pair of inverters, and the latch circuitry is configured to set the memory status value and the inverse value by selective coupling of the memory kill signal and the power-on-reset signal to the first and second connection points, wherein the memory kill signal is arranged to selectively couple a first voltage supply to the first connection point and to selectively couple a second voltage supply to the second connection point, and the power-on-reset signal is arranged to selectively couple the second voltage supply to the first connection point and to selectively couple the first supply voltage to the second connection point, wherein the first voltage supply provides a first voltage which represents one of a logical high and a logical low in the memory protection device and the second voltage supply provides a second voltage which represents the other of the logical high and the logical low not represented by the first voltage.

Traditionally, the expected arrangement might have been for each of the memory kill signal and power-on-reset signal to be configured to control the value on one side of the latch, i.e. at one of the first and second connection point. After all the value on only one side of the latch needs to be changed, and the circular feedback of the latch ensures that the value on the other side of the latch is updated one clock cycle later. However, the embodiments mentioned above advantageously provide a crossed configuration of the control connections provided by the memory kill signal and the power-on-reset signal for the coupling of the ground voltage supply and the power voltage supply to the first and second connection points, in which each of the memory kill signal and the power-on-reset signal selectively control both connection points. This advantage manifests itself in particular at lower voltages, and most particularly at sub-threshold voltages, which a hacker might try to apply to the memory protection device (and hence to the latch circuitry) which could otherwise risk the memory status value held by the latch circuitry being changed. This could then mean that, even after the assertion of the memory kill signal, the memory status value could be returned to an enabled state without a power reset taking place and thus allowing illegal normal access to the memory to resume. This is because of the indeterminate outcome which may result from lowering the voltage supply provided to one inverter of the latch circuit and to a transistor which provides the selective coupling of one of the connection points to one of the voltage supplies, specifically because it is unknown which of these components will switch first in this indeterminate sub-threshold regime. The crossed configuration of the control connections of these embodiments, with both connection points being controlled by both the memory kill signal and the power-on-reset signal, addresses this and provides resilience to it.

The received control signal could take a variety of forms, but in some embodiments the control circuitry comprises an arming stage and a killing stage, wherein the received control signal comprises an arming control signal followed by a killing control signal, and wherein the arming stage is configured to generate an armed signal in response to the arming control signal, the killing stage configured to be inactive until the armed signal is generated, and the killing stage is configured to generate the memory kill signal when the armed signal is asserted and the killing control signal is received. The disablement of the memory provided by the memory protection device is a fatal and irreversible step to the content of the memory. The sub-division of the received control signal into an arming control signal and a subsequent killing control signal improves the likelihood that either the received control signal will not be unintentionally asserted or that the received control signal will not be mistakenly interpreted as asserted. It is the killing stage of the control circuitry in these embodiments which generates the memory kill signal, after the armed signal is asserted and the killing control signal is received. Furthermore the killing stage is inactive until the armed signal is generated. Thus a reliable two-step process for disabling the memory is provided, which is highly unlikely to be unintentionally asserted or misinterpreted as asserted.

In some embodiments the control circuitry is configured such that after the memory kill signal is generated the control circuitry is disabled and is only enabled again after power-up. This further supports the configuration of the memory protection device to have a one-way disablement process in which, once the memory kill signal is generated and thus the memory status value held in the latch circuitry is switched to indicate the disabled state, the control circuitry is disabled meaning that intervention to the control circuitry to try to vary the memory status value cannot be carried out.

The arming control signal and the killing control signal may take a variety of forms, but in some embodiments the control circuitry comprises edge detection circuitry, the edge detection circuitry configured to identify the arming control signal from a first type of edge of the received control signal followed by a second type of edge of the received control signal, and the edge detection circuitry is configured to identify the killing control signal from a further type of edge of the received control signal, wherein the first type of edge, the second type of edge, and the further type of edge are selected from: a rising edge and a falling edge, and the first type of edge and second type of edge differ from one another.

For example, the first type of edge may be a rising edge of the received control signal, the second type of edge may be a falling edge of the received control signal, and the further type of edge may be a further rising edge of the received control signal. Various other permutations of the particular sequence of edges are also contemplated.

Hence, although the received control signal may be variously defined, these embodiments recognise that the particular configuration of the received control signal can nevertheless have an influence on the reliability of the operation of the memory protection device. One example of this relates to the form of the arming control signal, the assertion of which already sets the memory protection device on the above-mentioned one-way path to disablement and accordingly it is useful for the arming control signal to be difficult to misinterpret and its definition as being a first type of edge (e.g. a rising edge) followed by a second type of edge (e.g. a falling edge) of the received control signal supports this. In a different manner it is advantageous if the disablement of the memory is carried out as soon as possible after the killing control signal is asserted and this is supported by the killing control signal being defined as only a single further type of edge (e.g. a rising edge) of the received control signal.

The edge detection circuitry may be configured in a variety of ways, but in some embodiments the edge detection circuitry comprises pulse generation circuitry configured to generate a pulse signal in response to an edge of the received control signal, wherein the pulse generation circuitry comprises delaying circuitry configured to generate a delayed version of the received control signal as part of generating the pulse signal. The provision of delaying circuitry configured to generate a delayed version of the received control signal enables a received edge (whether rising or falling) to be translated into a pulse signal which then represents a well defined control signal which can be used to effect changes in the rest of the memory protection device, in particular by means of the generation of the memory kill signal in the control circuitry. For example, to generate a pulse from a rising edge the received control signal and a delayed version of the received control signal can be provided as the inputs to a NAND gate. Conversely to detect a falling edge a NOR gate can be used.

In some embodiments, the delaying circuitry comprises at least one inverter, wherein a PMOS diode is interposed on a supply voltage connection of the at least one inverter. This advantageously adds to the delay in switching of the at least one inverter without requiring a longer channel sized inverter itself to be provided. More generally, this thus supports the smaller footprint of the memory protection device.

In some embodiments the control circuitry comprises at least one reset transistor configured to set at least one internal value of the control circuitry on power up, wherein setting of the at least one internal value by the at least one reset transistor is enabled by assertion of the power-on-reset signal. Accordingly, through the provision of the at least one reset transistor the at least one internal value of the control circuitry can be more reliably set on power up. For example, this can avoid arming the memory protection device (as though an arming control signal had already been received) during start up due to a process defect or a simple glitch. Accordingly, in some embodiments the armed signal (generated by the arming stage in response to the arming control signal) is set to a non-asserted state by a predetermined reset transistor in response to assertion of the power-on-reset signal.

Viewed from a second aspect the present invention provides a memory protection device for controlling access to a memory comprising: means for holding a memory status value, the memory status value indicative of whether the memory is in an enabled state or in a disabled state, and resetting the memory status value on power-up when a power-on-reset signal is asserted such that the memory status value indicates the enabled state; means for asserting a memory kill signal in response to assertion of a received control signal; means for switching the memory status value to indicate the disabled state in response to assertion of the memory kill signal, wherein after the memory status value is switched to indicate the disabled state the memory status value cannot be changed to the enabled state without power resetting the memory protection device, and wherein after power resetting the power-on-reset signal is asserted; and means for forcing an enable signal provided by enable signal circuitry of the memory to be provided in a disabled state when the memory status value held is asserted.

Viewed from a third aspect the present invention provides a method of controlling access to a memory with a memory protection device comprising the steps of: holding a memory status value, the memory status value indicative of whether the memory is in an enabled state or in a disabled state, and resetting the memory status value on power-up when a power-on-reset signal is asserted such that the memory status value indicates the enabled state; asserting a memory kill signal in response to assertion of a received control signal; switching the memory status value to indicate the disabled state in response to assertion of the memory kill signal, wherein after the memory status value is switched to indicate the disabled state the memory status value cannot be changed to the enabled state without power resetting the memory protection device, and wherein after power resetting the power-on-reset signal is asserted; and forcing an enable signal provided by enable signal circuitry of the memory to be provided in a disabled state when the memory status value held is asserted.

BRIEF DESCRIPTION OF THE DRAWINGS

The present invention will be described further, by way of example only, with reference to embodiments thereof as illustrated in the accompanying drawings, in which.

DESCRIPTION OF THE PREFERRED EMBODIMENTS

Figure 1:
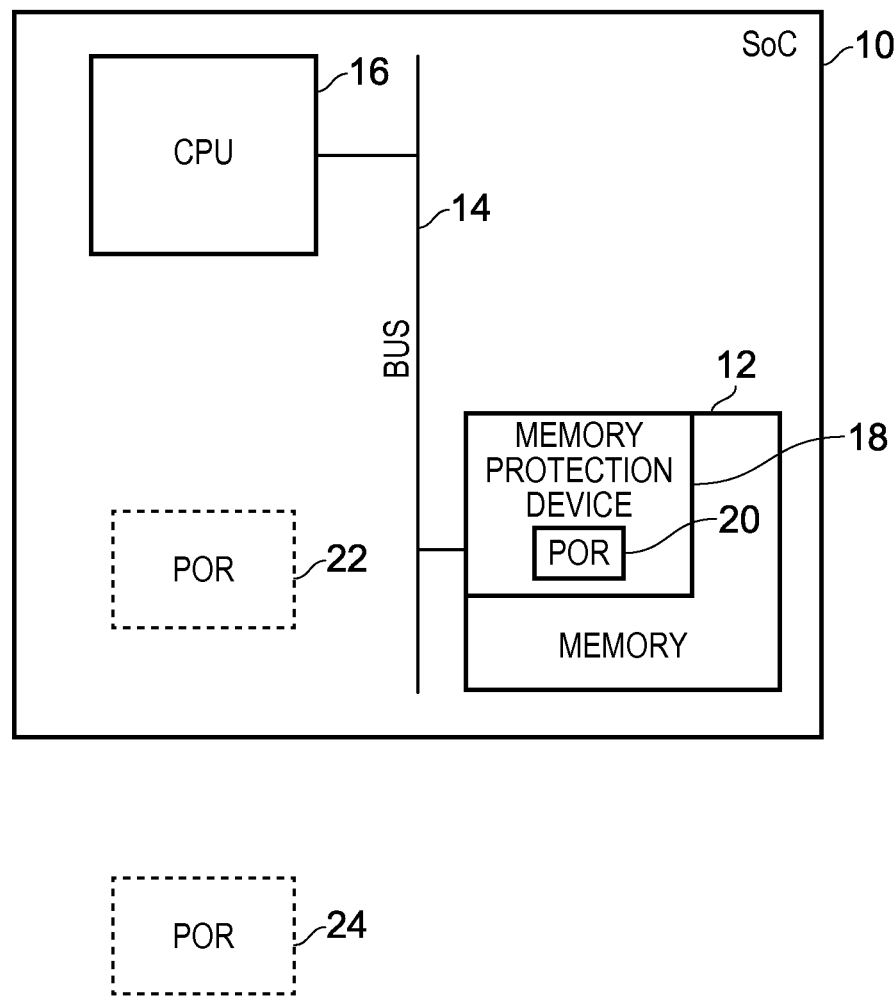
FIG. 1 schematically illustrates a system-on-chip device comprising a memory which itself comprises a memory protection device in one embodiment.

FIG. 1 schematically illustrates a system-on-chip (SoC) device in one embodiment. Only very few components of the SoC 10 (those relevant to the present description) are illustrated for the purposes of clarity. A memory 12 is coupled via a system bus 14 to a central processing unit (CPU) 16, thus generally giving the CPU 16 access (both read and write) to the content of the memory 12. The memory 12 further comprises a memory protection device 18 which, as will be described in much greater detail below, is configured to protect access to the memory. In particular after a predetermined signal has been received by the memory protection device it is configured to prevent further access to the content of the memory 12, until after a power reset of the SoC 10 has been performed. In the embodiment shown in FIG. 1 the memory protection device 18 is provided with power-on-reset circuitry (POR) 20 which, as will be described in more detail below, is configured to ensure that on start up the memory 12 starts in a normal operating mode. FIG. 1 however also illustrates two alternative locations where the power-on-reset (POR) circuitry could be provided, a first 22 being separately on the SoC 10 and a second 24 even being off-chip. However, given the important function that the power-on-reset circuitry performs, it is preferred if this component is provided within the memory protection device 18 itself, because of the increased security associated therewith. Although power-on-reset circuitry such as 22 and 24 may already be provided, and therefore a small amount of area could be saved by not providing the power-on-reset circuitry 20 within the memory protection device 18, on the one hand this saving is minimal due to the limited area it in fact occupies and on the other hand the power-on-reset signal generated by power-on-reset circuitry such as 22 and 24 is significantly more vulnerable to hacking attack because of the number of places on the SoC 10 where this signal is used, thus providing the hacker with various different opportunities for forcing its value, and indeed in the case of power-on-reset circuitry 24 which is off-chip this signal may be explicitly exposed at a peripheral pin.

Figure 2:
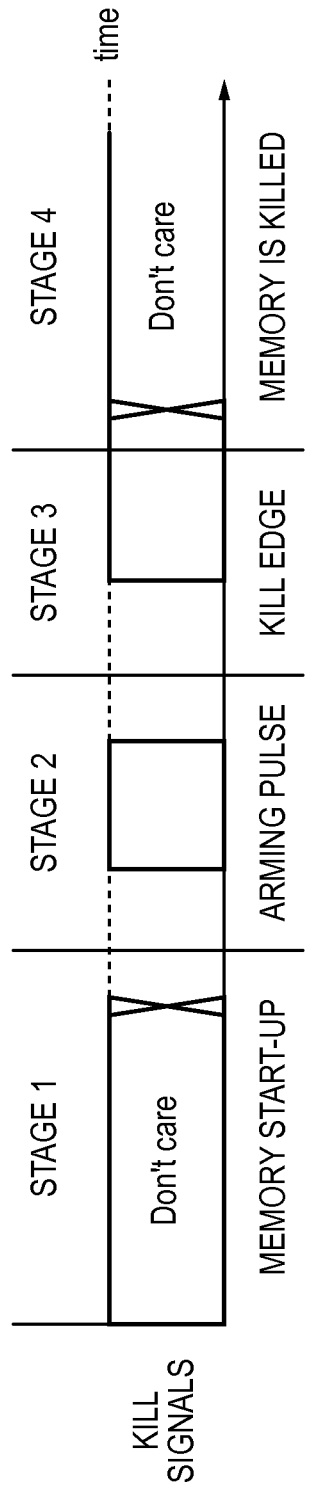
FIG. 2 schematically illustrates the sequence in time of the memory start-up, the arming pulse, the kill signal and the disablement of the memory in one embodiment.

FIG. 2 schematically illustrates the time sequence of the killing (permanently disabling until after another start-up) of the memory in one embodiment. In a first stage where the memory is starting up the kill signals are irrelevant. However, once into a second stage in which the memory has fully started up then the memory protection device can be armed when an arming pulse (a rising edge followed by a falling edge) is received. Thereafter once the memory protection device is in its armed state, in a third stage the memory is permanently disabled (killed) after a kill signal (a single rising edge) is received. Thereafter (stage 4) the memory is killed and cannot be accessed until after a memory start up has been performed, when the illustrated time sequence begins from the left again. It should be noted that the timescale shown in FIG. 2 is highly non-linear and should not be taken as representative of the relative times taken for particular events to take place. Only the ordering of the events is significant. In particular, it is a feature of the present invention that the memory is killed very quickly after the kill edge is received, but these are illustrated separately (stage 3 and stage 4) in FIG. 2 for discussion purposes only.

Figure 3:
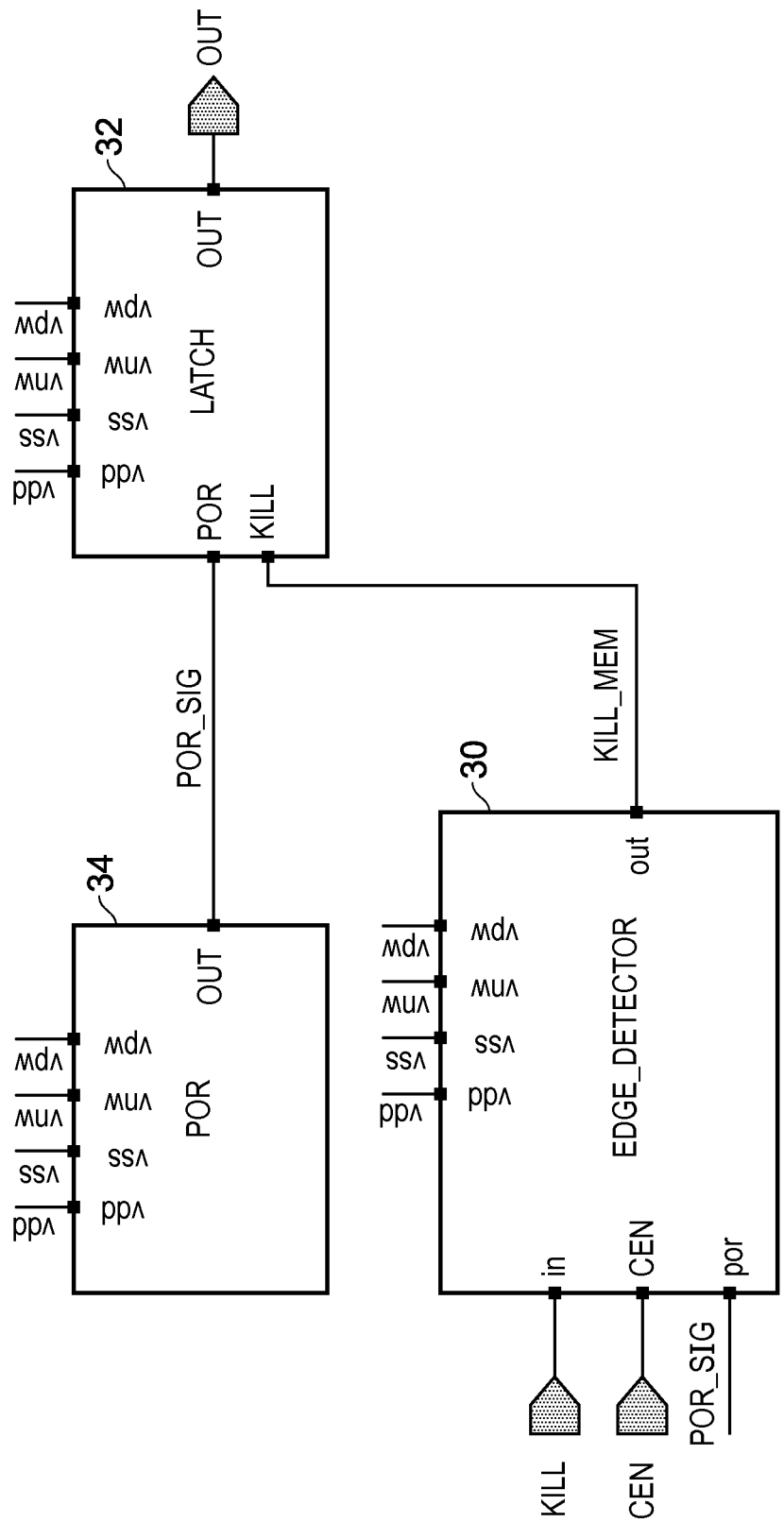
FIG. 3 schematically illustrates some components of a memory protection device in one embodiment.

FIG. 3 schematically illustrates three major components of a memory protection device (such as that illustrated in FIG. 1) in one embodiment. These components are an edge detector 30 which detects the various transitions of the KILL signal to arm and kill the memory (by asserting the KILL_MEM signal), a latch 32 which stores the state of the memory, i.e. either enabled or disabled (killed), and power-on-reset (POR) unit 34 which guarantees that the memory starts in a normal operating mode (by the assertion of its output signal POR_SIG). Note that the signal POR_SIG is also provided as one input to the edge detector 30. The clock enable signal (CEN) is also an input to the edge detector 30. The state of the memory stored in the latch 32 is also provided at its output as the signal OUT. Each of the components 30, 32, 34 is powered by connection to a power voltage supply VDD and a ground voltage supply VSS. Note that the components in FIG. 3 (and indeed in the detailed circuit illustrations in the following figures) are shown to have further power inputs VNW and VPW which can be used to bias the bulk of the respective subcomponents (i.e. to provide respective substrate biases). These would typically be a connection of the respective n-well or p-well to VDD or VSS in dependence on the type. However, these VNW and VPW are non-essential and in particular are not of relevance to the present disclosure and therefore are not discussed any further herein.

Figure 4:
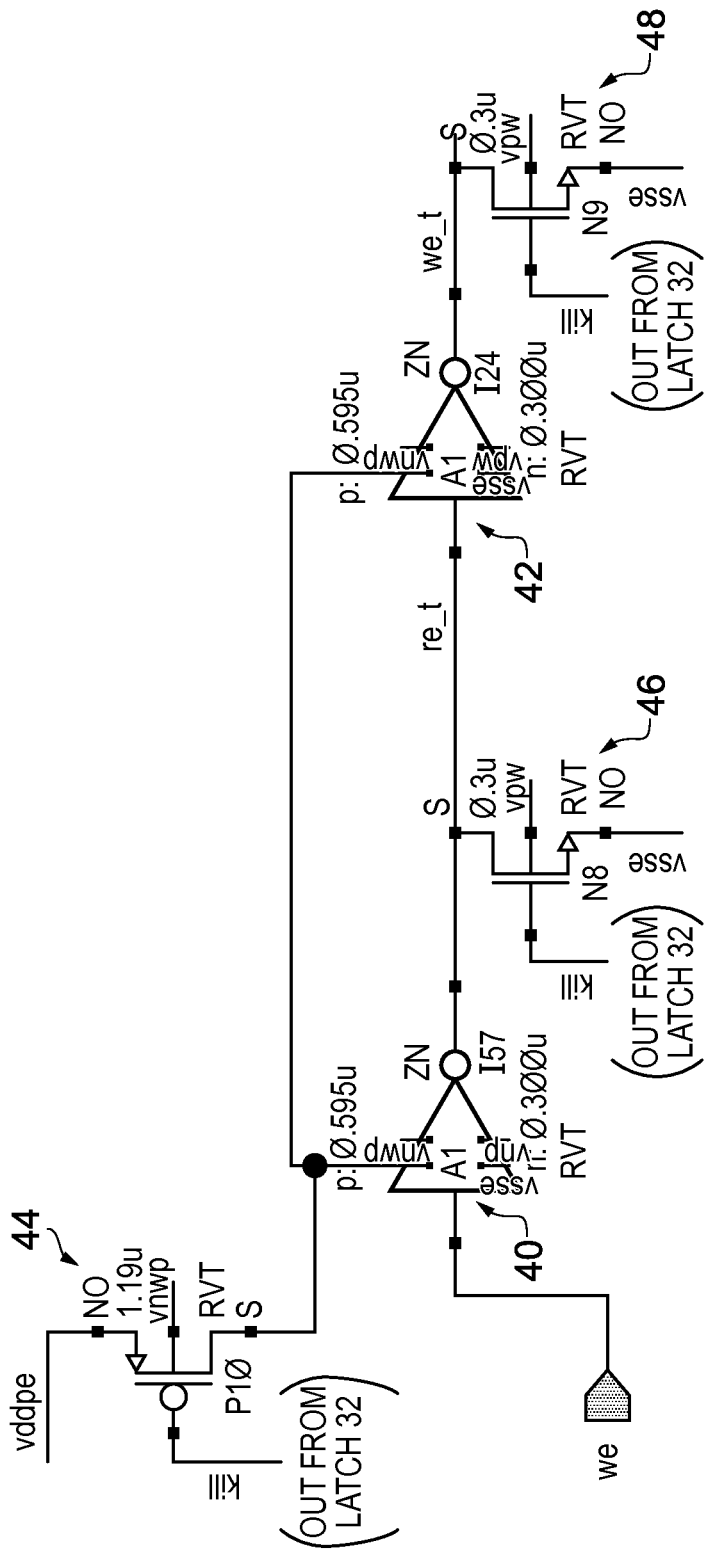
FIG. 4 schematically illustrates in detail the configuration of disabling circuitry coupled to enable signal generation circuitry of the memory in one embodiment and a variant is also shown.

FIG. 4 schematically illustrates in detail the configuration of the enable signal generation circuitry of the memory in one embodiment. The enable signal generation circuitry essentially comprises inverters 40 (also labelled I57) and 42 (also labelled I24). The provision of these inverters enables a received write enable signal "we" to generate the read enable signal "re_t" and the write enable signal "we_t". The disabling circuitry provided by the present techniques comprises the additional transistors 44 (also labelled as P10), 46 (also labelled as N8) and 48 (also labelled as N9). These additional transistors form two NOR gates with the existing inverters 40 and 42. It should be noted that the transistors 44, 46 and 48 are sized such that they do not delay the normal timings of the read enable signal re_t and the write enable signal we_t. The transistors 44, 46 and 48 are each switched in dependence on the signal OUT generated by the latch 32 (see FIG. 3). When this signal is asserted both the signal re_t and the signal we_t are pulled down to VSSE, disabling each. Accordingly, when the OUT signal is asserted by the latch 32 neither read nor write access to the memory can take place. It is to be noted that the embodiments described herein use the logical convention that VDD corresponds to a logical "1" ("high") and is used for "enabled" or "active" states, whilst VSS corresponds to a logical "0" ("low") and is used for "disabled" or "inactive" states, but it will be recognised by one of ordinary skill in the art that this convention is an arbitrary choice and the opposite configuration could also be used (and hence is equally contemplated by the present disclosure).

FIG. 4 also shows a variation for use in a ROM memory configuration, in which there is no equivalent to a "write enable" signal, and instead access to the memory can be controlled by the present techniques by overriding the CEN (clock enable) signal. The comment lower left in FIG. 4 sets out the changes in this variant in which the signals labelled "we"/"we_t" in FIG. 4 are replaced by "CEN", the node "re_t" is redundant and the transistor N8/46 can be removed. Overriding of the CEN signal is then controlled by the kill signal (OUT from latch 32) driving the gates of transistors 44 and 48.

Figure 5:
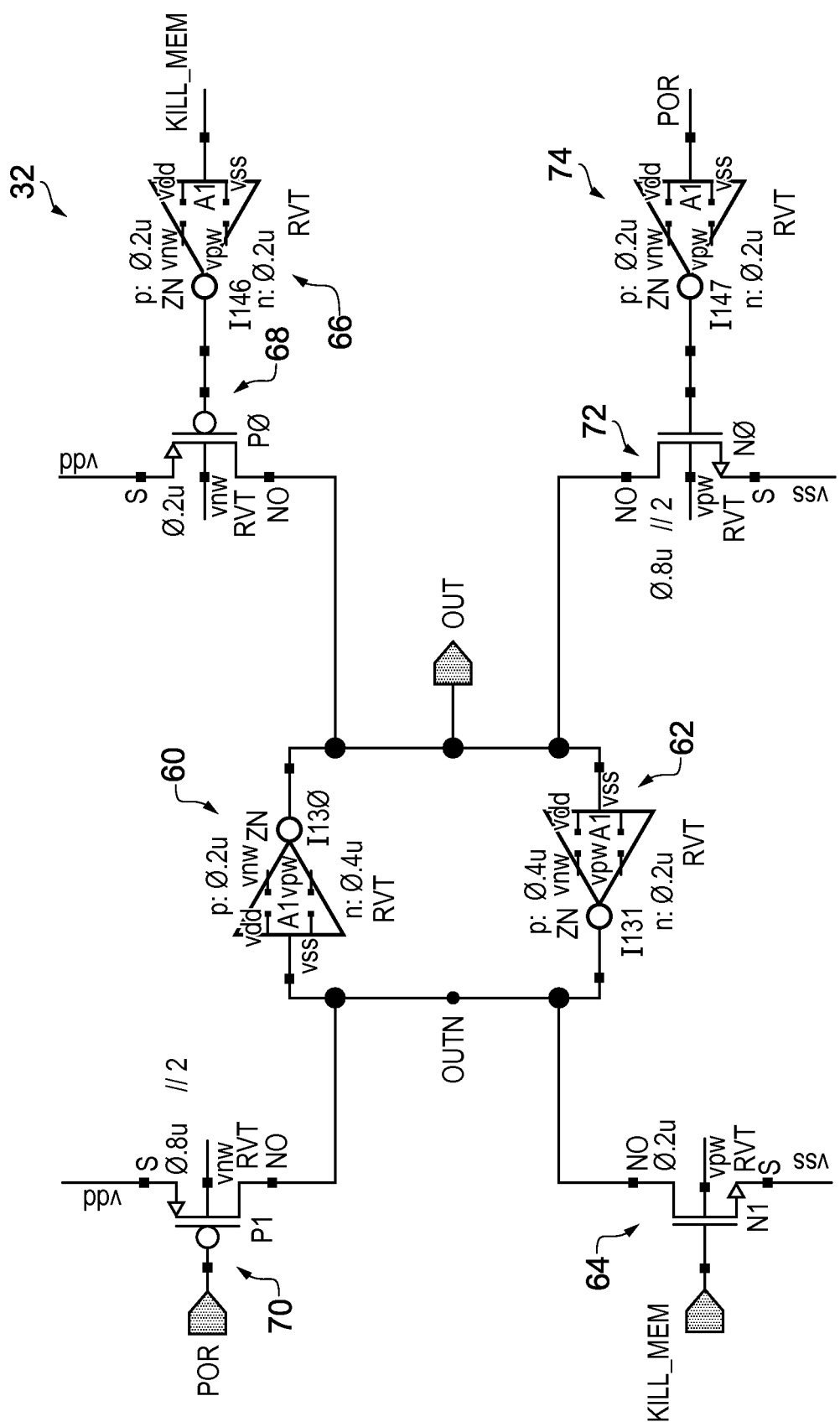
FIG. 5 schematically illustrates in detail the configuration of latch circuitry in one embodiment.

FIG. 5 schematically illustrates in detail the configuration of the latch circuit 32 shown in FIG. 3. The latch itself, which stores the memory status value (indicating enabled or disabled/killed), is formed by two cross-coupled inverters 60 (also labelled I130) and 62 (also labelled I131). A particular feature to note about the configuration of the inverters 60 and 62 is the sizing of their PMOS and NMOS transistors. As shown in the figure, inverter 60 comprises a PMOS sized as 0.2 μm, whilst its NMOS transistor is sized as 0.4 μm. This is an atypical arrangement since the PMOS is half the size of the NMOS. Conversely note that the inverter 62 comprises PMOS and NMOS transistors in which these sizings are reversed, the PMOS being sized as 0.4 μm and the NMOS being sized as 0.2 μm, this being a more "normal" configuration. The relative sizing of the PMOS and NMOS transistors in the two invertors has the particular benefit that on start up the latch will tend to take a configuration in which the value held at the node to which the OUT output is connected will be low, whilst the opposite side of the latch (OUTN) will be high. This ensures that the memory can be properly used (with normal read and write access available) after start up.

The KILL_MEM signal generated by the edge detector 30 (see FIG. 3) is used to put the latch into the opposite state, thus killing the memory. This is done by means of the provision of the NMOS transistor 64 (also labelled N1) and the combination of the PMOS transistor 68 (also labelled P0) and the inverter 66 (also labelled I146). The assertion of the KILL_MEM signal thus causes both of these transistors 64, 68 to switch on, coupling VDD to OUT and coupling VSS to OUTN. The latch thus transitions into its "killing" state in which it holds a memory status value indicating a disabled state and further access to the memory is not possible. To re-enable the memory it can be seen from FIG. 5 that both the signal POR and the KILL_MEM signal will have to return to low. This can only be achieved by performing a power reboot of the system. In an analogous fashion to that described for the KILL_MEM signal, the POR signal selectively couples VDD and VSS to the two nodes of the latch OUTN and OUT, a PMOS transistor 70 (also labelled P1) selectively coupling VDD to OUTN and an NMOS transistor 72 (also labelled N0) selectively coupling VSS to OUT. The gate of transistor 72 is coupled to an inverted version of the POR signal, inverter 74 (also labelled I147) providing this inversion. Thus when both POR and KILL_MEM signals are low, transistors 70 and 72 are switched on, whilst transistors 64 and 68 are switched off, pulling OUTN up to VDD and pulling OUT down to VSS. Normal access to the memory is then possible. Notice also with respect to the configuration shown in FIG. 5 that the transistors which the respective signals POR and KILL_MEM are coupled to lie in a crossed configuration across the latch, with each of POR and KILL_MEM directly controlling both OUT and OUTN. Logically under normal circumstances it would be possible for each of POR and KILL_MEM to only control one side of the latch (since the value imposed on one side of the latch will be propagated, inverted, to the other side of the latch at the next clock cycle). However, the crossed configuration provided has a particular advantage when VDD is particularly low, i.e. during start up or if a hacker were to artificially lower VDD. Otherwise, taking the situation where the latch is holding a high value at OUT and a low value at OUTN, as VDD is lowered, and in particular as the transistor 62 and the transistor 64 enter their sub-threshold regime, an instability could arise due to the fact that it is unpredictable which of transistor 62 and 64 will switch first and it could happen that the switching ordering could result in the value at OUTN going high, and hence OUT switching back to its low configuration, i.e. allowing normal memory access to resume. The crossed configuration of the POR and KILL_MEM gated transistors on both sides of the latch mitigates against this problem.

Figure 6:
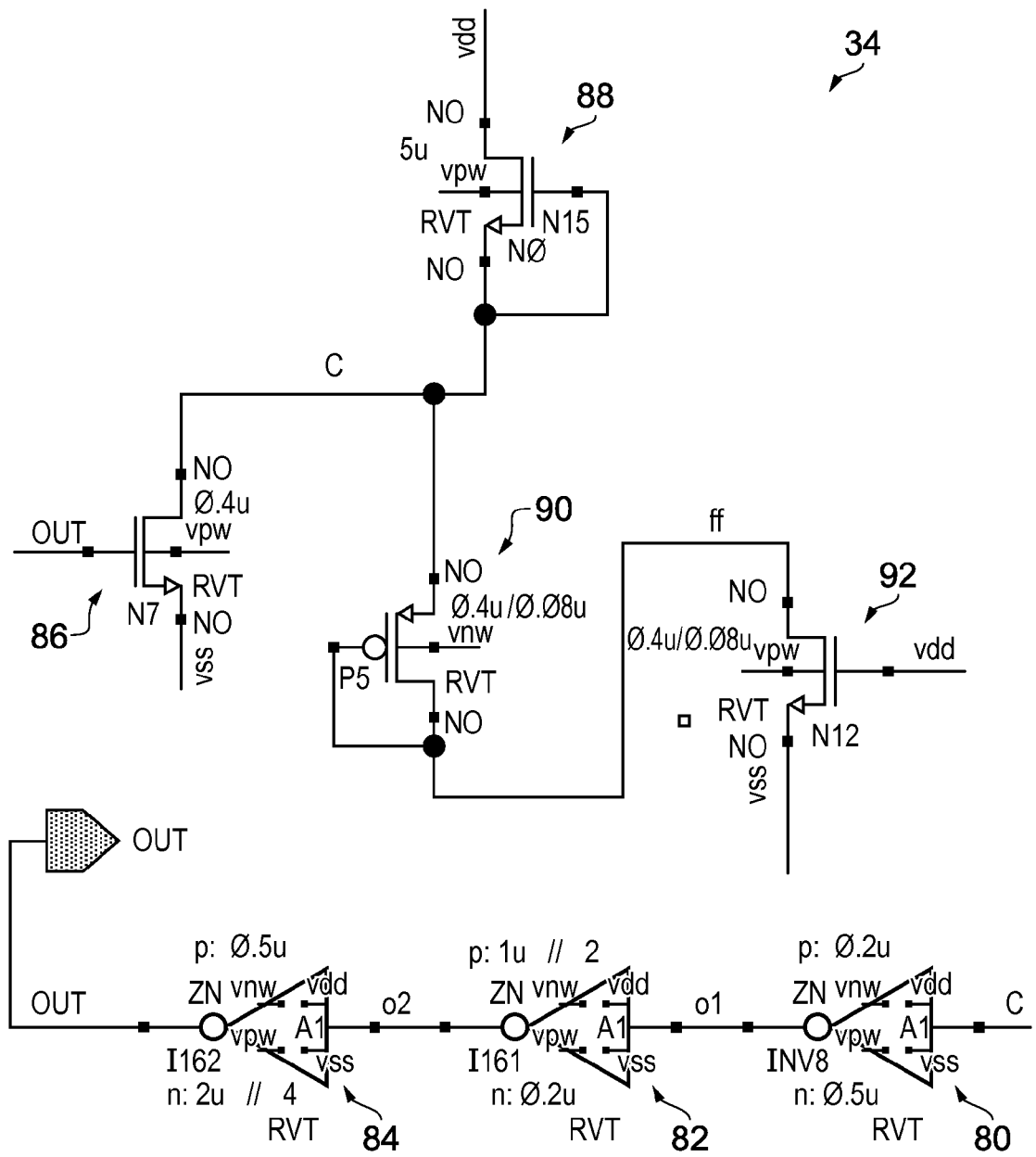
FIG. 6 schematically illustrates in detail the configuration of power-on-reset circuitry in one embodiment.

FIG. 6 schematically illustrates in detail the configuration of the power-on-reset (POR) circuit 34 shown in FIG. 3. The POR circuit 34 is configured to detect the power (VDD) applied to the memory protection device 18 (i.e. that present on-chip) and to generate a reset impulse (OUT) that goes to the whole of the memory protection device 18 to put it into a known state. No input is required other than the power supply VDD. Referring to FIG. 3 it can be seen that the output (OUT/POR_SIG) of the POR circuit 34 resets both the latch 32 and the edge detection 30. The VDD behaviour during start up can be modelled using a simple ramp signal. In the initial low voltage regime the NMOS transistor 86 (also labelled N7) is switched off and hence the voltage divider provided by the diode-configured NMOS transistor 88 (also labelled N15) and PMOS transistor 90 (also labelled P5) dominates the behaviour of the POR circuit 34. These diode-configured transistors 88 and 90 (diode-configured by self-coupling their gates) in particular enables them to operate with large resistor-like behaviour at low voltages, but (being provided as transistors) do not take up the same area that the equivalent large resisters would require. NMOS transistor 92 (also labelled N12) is provided as an always-on "leaky transistor", to allow PMOS 90 to act as a diode by providing a small voltage drop to VSS. Hence, in this low voltage regime, $V_C=P5/(P5+N15)*VDD$.

Whilst the circuit is initially starting up, node C (that is following the ramping of VDD) is considered to be a logical 1. The series of inverters 80 (also labelled INV8), 82 (also labelled I161) and 84 (also labelled I162) then output a logical 0. This output (OUT) drives the NMOS transistor 86 (also labelled N7) connected to the node C, and hence initially allows node C to follow VDD (subject to the voltage drop across NMOS 88).

VDD continues to ramp up and once VDD rises high enough for NMOS transistor 86 to switch on this clamps down node C. By positive feedback, node C is then considered to be a logical 0 by the input of the series of inverters 80, 82, 84. This makes the output signal (OUT) go high (logical 1) reinforcing the turning on of the NMOS 86. OUT then follows VDD and node C remains clamped to VSS.

Figure 7:
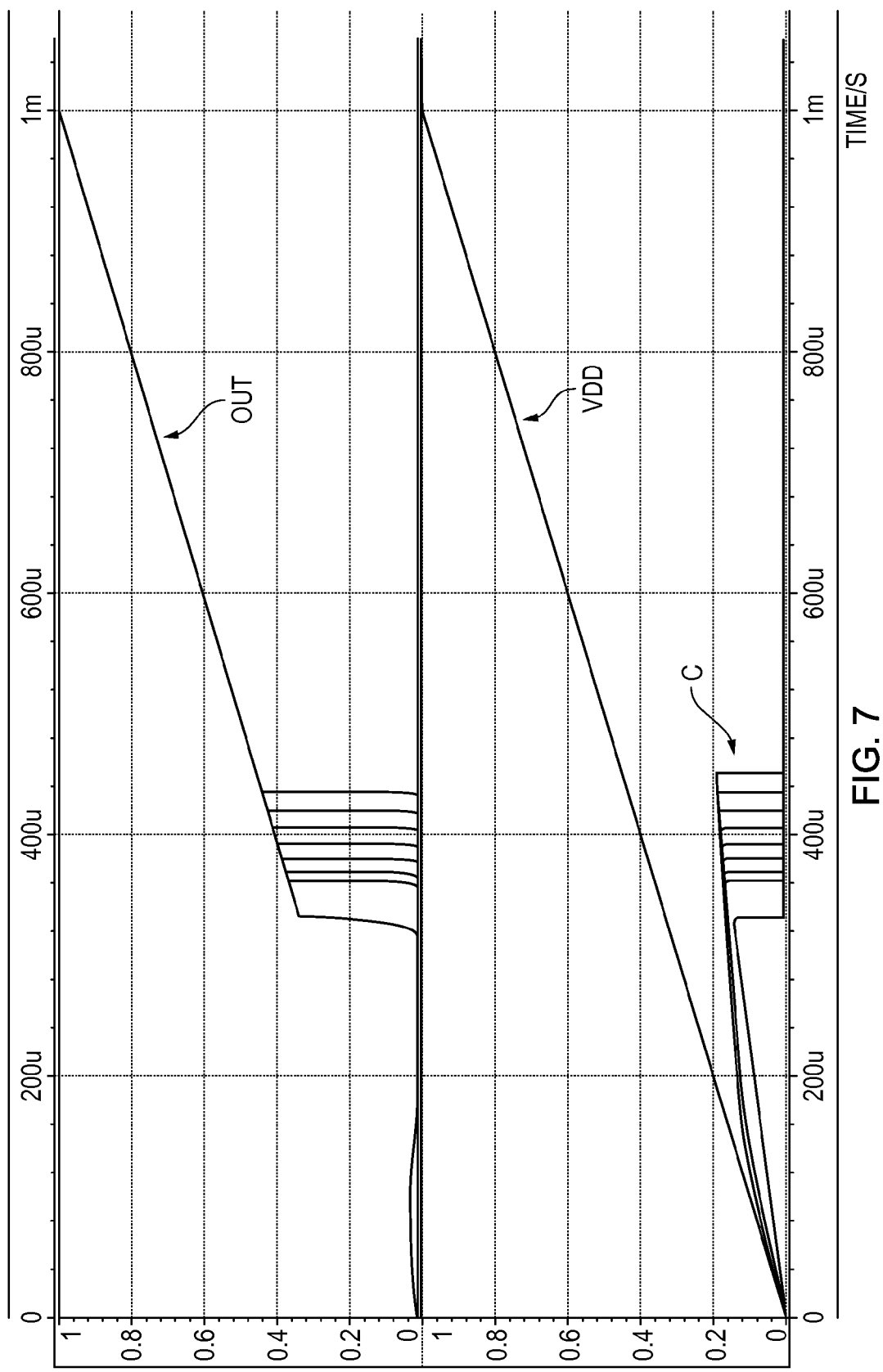
FIG. 7 shows the results of a simulation of the power-on-reset circuitry of FIG. 6.

FIG. 7 shows a simulation of the behaviour of the POR circuit 34 as VDD changes and at temperatures ranging from −40° C. to 140° C. in the TT (typical-typical) corner. VDD is simply represented by a ramping voltage. Note that the voltage at node C starts by following VDD and making the signal OUT stay low. As mentioned above, once the inverters consider the voltage at node C to be a logical 0 the signal OUT takes the value high or VDD. This turns on the NMOS 86 that clamps down the node C.

Figure 8:
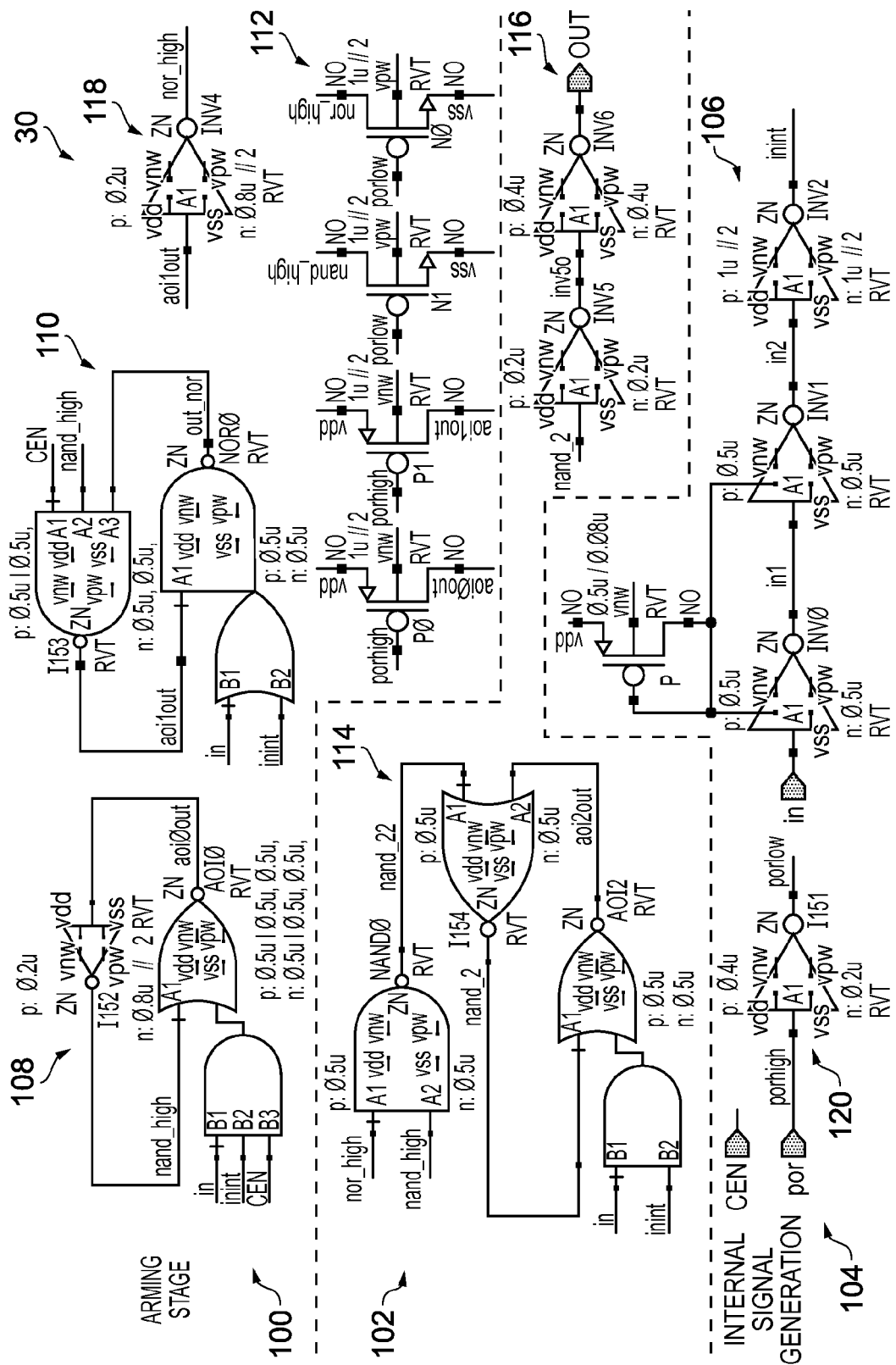
FIG. 8 schematically illustrates in detail the configuration of the arming stage and killing stage of control circuitry in one embodiment.

FIG. 8 schematically illustrates in detail the configuration of the edge detector 30 shown in FIG. 3. The edge detector 30 consists of two main parts, namely an arming stage 100 and killing stage 102 which are shown in FIG. 8 divided by the upper dashed line. Also shown in FIG. 8 are some internal signal generation components 104 (below the lower dashed line). The main components of the edge detector 30, which will be described in more detail in reference to the following drawings, are delay generation circuitry 106, one-time raising edge detection circuitry 108, one-time falling edge detection circuitry 110, reset transistors 112, one-time rising edge detection circuitry 114 and output buffer 116. Also shown in FIG. 8, but not discussed in more detail hereinafter are the two inverters 118 and 120. Inverter 118 is used to generate the output signal NOR_HIGH generated from the signal AOI1OUT from the one-time falling edge detection circuitry 110, whilst inverter 120 is used to produce an inverted version of the POR signal received.

Figure 9:
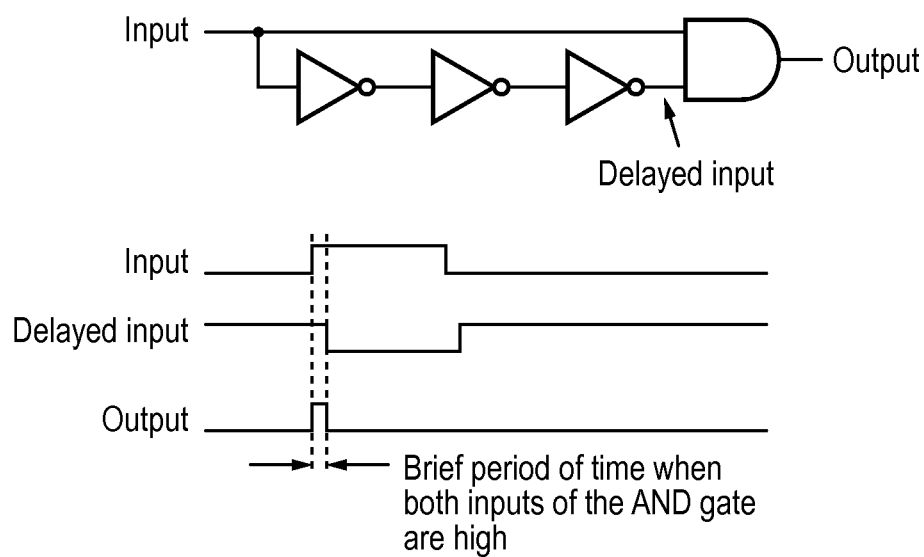
FIG. 9 schematically illustrates the principle of the generation of an output pulse in response to an edge detected in an input signal.

Both the arming stage 100 and the killing stage 102 rely on the same technique for edge detection, which is schematically illustrated in FIG. 9. An input signal forms one input to a gate, whilst a delayed input generated by an odd number of inverters is provided as the other input to the gate. This results in an output signal comprising a pulse which begins when the input signal makes a predetermined transition (i.e. an edge occurs) and ends when the delayed inverted version of the input signal makes the corresponding inverse transition. Note that the AND gate shown in FIG. 9 is merely a generic representation and typically to detect a rising edge a NAND gate is used, whilst to detect a falling edge a NOR gate is used.

Figure 10:
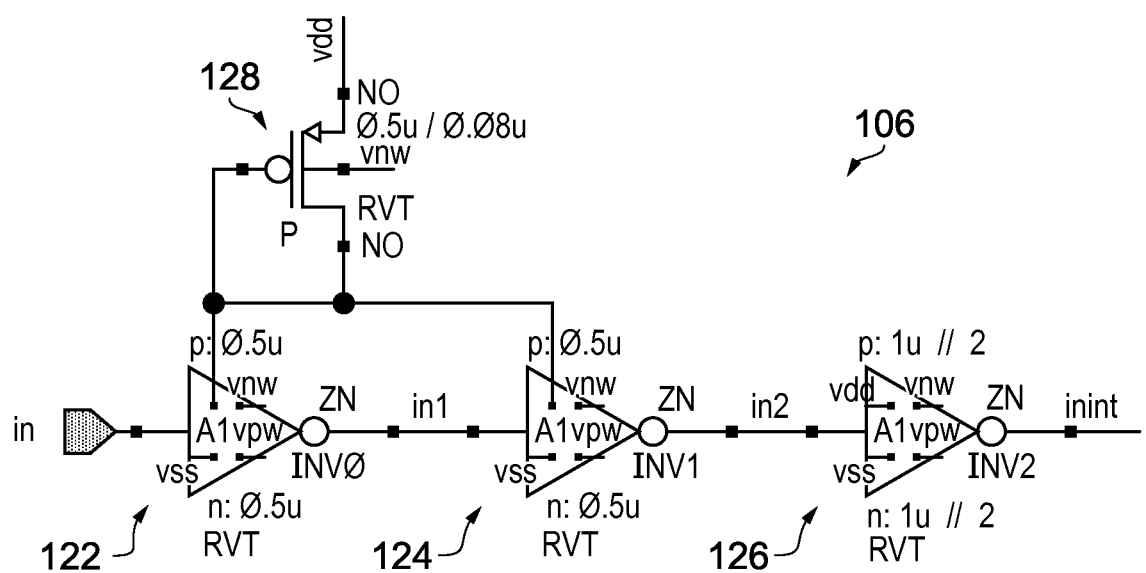
FIG. 10 illustrates in detail the configuration of the delay generation circuitry of the embodiment shown in FIG. 8.

FIG. 10 schematically illustrates the detail of the delay generation circuitry 106 shown in FIG. 8. The circuitry is used to produce the required delayed version of the input signal IN. The inverters 122 (also labelled INV0), 124 (also labelled INV1) and 126 (also labelled INV2) provide the required odd number of inverters to generate the inverted, delayed input signal. A PMOS diode 128 is also added on the VDD path of inverters 122 and 124 to further delay their switching.

Figure 11:
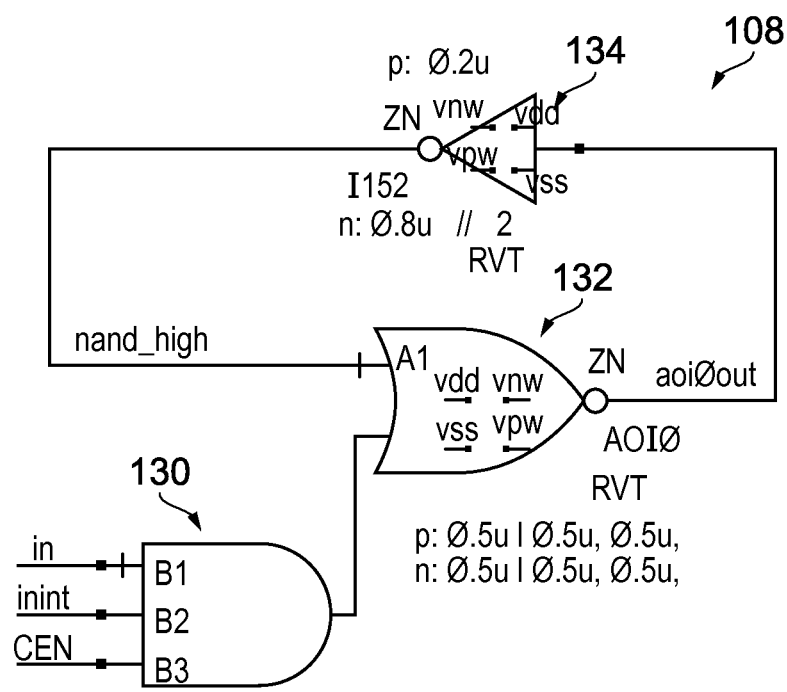
FIG. 11 schematically illustrates in detail the configuration of a one-time rising edge detector of the embodiment shown in FIG. 8.
Figure 13:
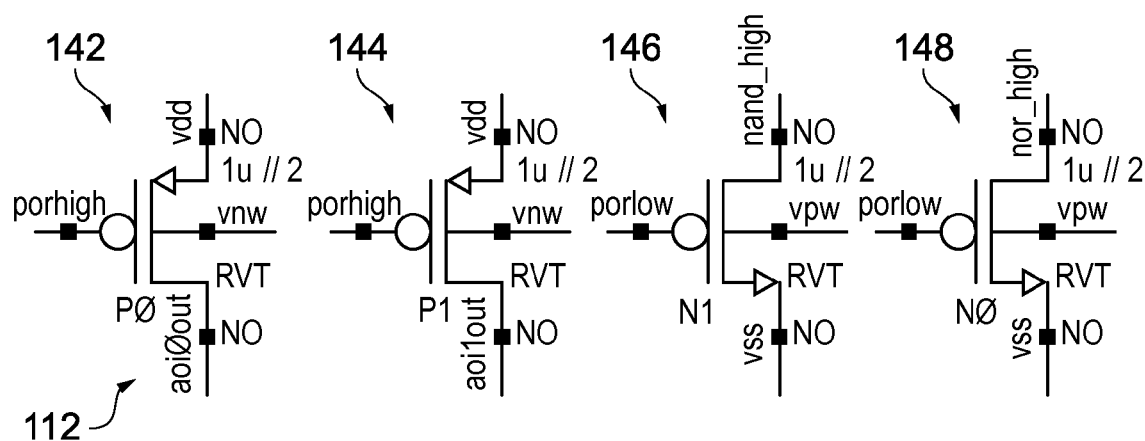
FIG. 13 schematically illustrates in detail the configuration of four reset transistors in the arming stage of the embodiment shown in FIG. 8.

FIG. 11 schematically illustrates the detail of the one-time rising edge detection circuitry 108 shown in FIG. 8. In order to "arm" the memory protection device the edge detection circuitry 30 first needs to receive a rising edge followed by a falling edge signal at the input IN. This sequence signals then locks (disables) the arming stage 100 and enables the killing stage 102. The one-time rising edge detection circuitry 108 comprises an AND gate 130, a NOR gate 132 (also labelled AOI0) and an inverter 134 (also labelled I152). The AND gate 130 represents the AND gate shown in FIG. 9 and requires both the input signal IN and its delayed version ININT to be asserted for its own output to be asserted. It additionally requires the clock enable signal CEN to be asserted. Accordingly, this component generates an output pulse when a rising edge is detected. This rising edge provides one of the inputs to the NOR gate 132, the other input to the NOR gate 132 being an inverted version (NAND_HIGH) of its own output signal AOI0OUT. Inverter 134 (also labelled I152) generates NAND_HIGH from AOI0OUT. Hence, before the rising edge is detected the low output of AND gate 130 and the low state of NAND_HIGH generate a high value of a AOI0OUT (which is then stably held in this state by means of the feedback loop). Note that NAND_HIGH is explicitly reset to be low as part of the start up process for the memory detection device (see FIG. 13). When the rising edge is detected the output pulse generated by the AND gate 130 causes AOI0OUT to go low and thus NAND_HIGH to go high. This state of the one-time rising edge detection circuitry 108 is then locked in (i.e. regardless of further changes seen by the inputs of the AND gate 130) by means of the feedback loop and the one-time rising edge detection circuitry 108 is then effectively disabled until the memory protection device power restarts.

Figure 12:
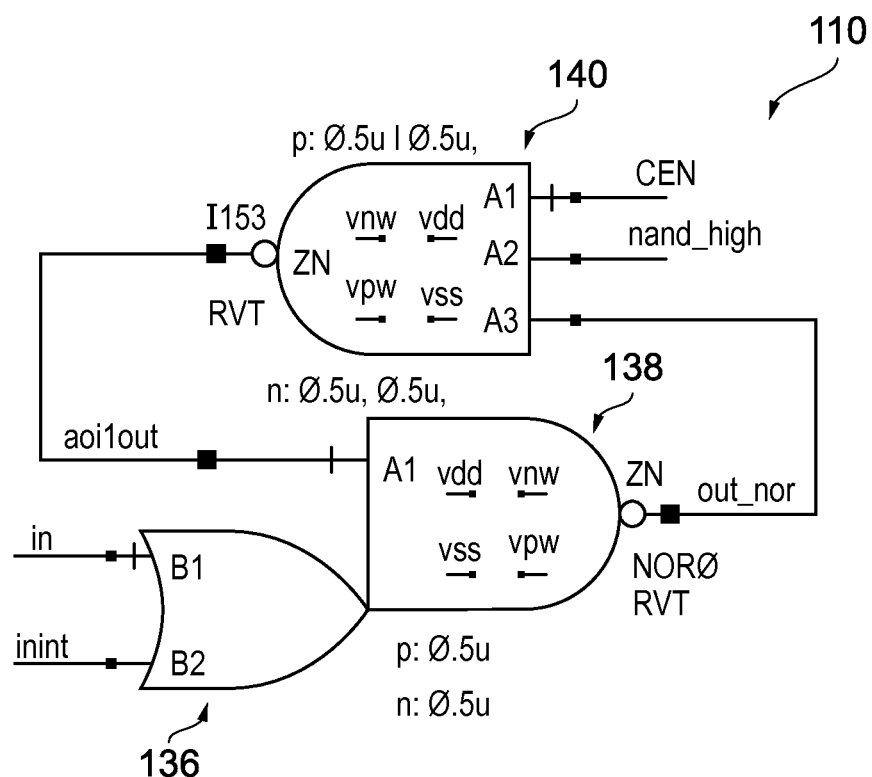
FIG. 12 schematically illustrates in detail the configuration of a one-time falling edge detector of the embodiment shown in FIG. 8.

FIG. 12 schematically illustrates in detail the one-time falling edge detection circuitry 110 shown in FIG. 8. This comprises OR gate 136, NAND gate 138 and NAND gate 140. This second part of the arming stage 100 detects the falling edge of the arming signal. A falling edge seen in the input signal IN thus causes the output of OR gate 136 to pulse low, thus causing the output of NAND gate 138 OUT_NOR to pulse high. This high value of OUT_NOR, in combination with the high values of CEN and NAND_HIGH thus cause the output of NAND gate 140 to go low. This low value of AOI1OUT, as the other input to NAND gate 138, thus locks in this state to the feedback loop of the one-time falling edge detection circuitry 110. Thus, both NAND_HIGH and NOR_HIGH (the inverse of AOI1OUT—see inverter 118 in FIG. 8) then stay locked as high.

To avoid arming the arming stage 100 of the edge detection circuitry 30 during start up, for example due to a process defect or a simple glitch, four reset transistors 112 are provided. These are shown in detail in FIG. 13. Reset PMOS transistors 142 (also labelled P0) and 144 (also labelled P1) are driven by the input signal PORHIGH (i.e. the un-inverted version of the power-on-reset signal POR— see item 120 in FIG. 8), whilst reset NMOS transistors 146 (also labelled N1) and 148 (also labelled N0) are driven by the inverted version of this signal PORLOW. These ensure that the arming stage 100 is powered up to its correct state, i.e. ready to be armed and not already armed, and the respective signals AOI0OUT, AOI1OUT, NAND_HIGH and NOR_HIGH take on their correct initialization values at start-up.

Figure 14:
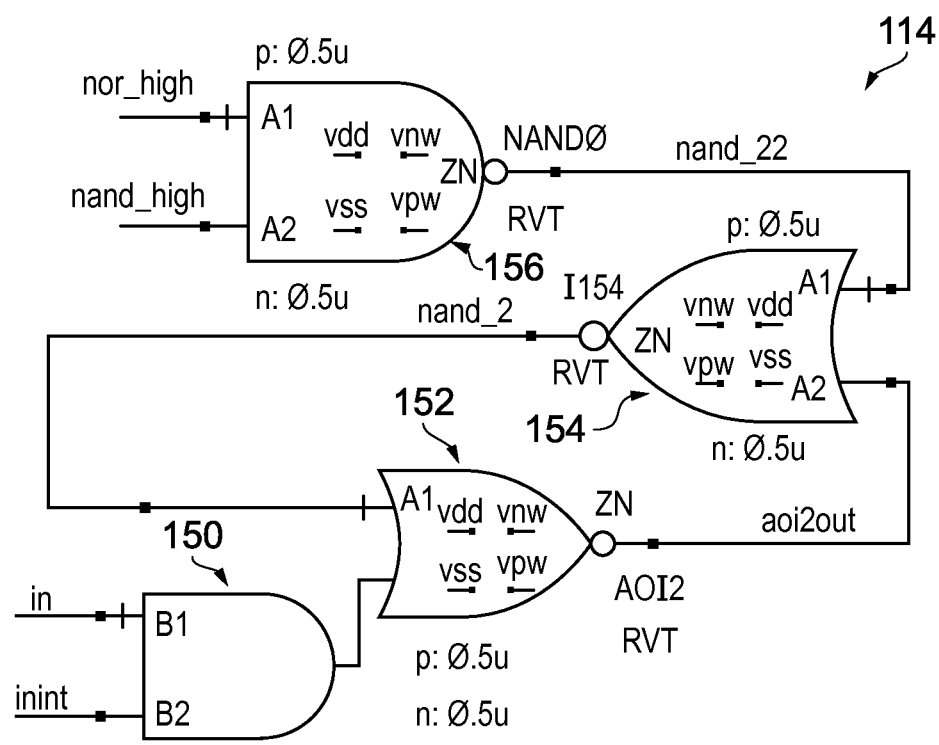
FIG. 14 schematically illustrates in detail the configuration of part of the killing stage of the embodiment shown in FIG. 8.

FIG. 14 schematically illustrates in detail the configuration of the one-time rising edge circuitry 114 in the killing stage 102 of the edge detector 30. This comprises AND gate 150, NOR gate 152 (also labelled AOI2), NOR gate 154 (also labelled I154) and NAND gate 156 (also labelled NAND0). The provision of the NAND gate 156 ensures that the killing stage is only active when both NOR_HIGH and NAND_HIGH signals are each high. This means that the killing stage 102 is only active, and waiting to catch the next rising edge of the input signal, when the edge detection circuitry 30 has been previously armed (in its arming stage 100) by the observation of the required rising edge, then falling edge. Thereafter, and in a very similar configuration to the one-time rising edge detection circuitry 108 in the arming stage 100, when a rising edge is seen on the input signal IN, a pulse is generated by the AND gate 150, which causes the output of the NOR gate 152 to go low. This low input to the NOR gate 154 (where its other input is already low by the pre-condition of the high status of both NOR_HIGH and NAND_HIGH) causes the output of the NOR gate 154 (NAND_2) to go high. This high value of NAND_2 is then locked into the feedback loop of the one-time rising edge detection circuitry 114. Note that prior to the rising edge killing signal being received a low value of NAND_2 is locked into this feedback loop by virtue of the correct initialization pre-setting of NOR_HIGH and NAND_HIGH provided by the reset transistors 112 (see FIG. 13).

Figure 15:
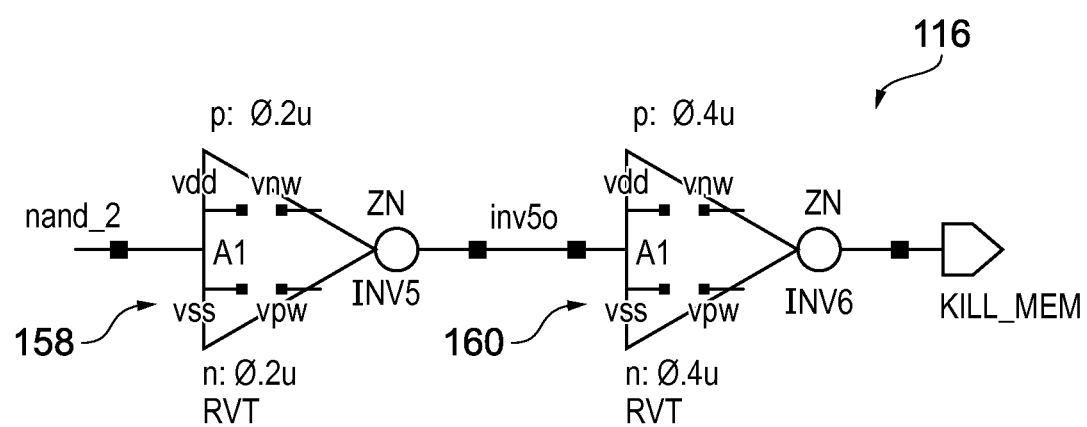
FIG. 15 schematically illustrates in detail an output buffer of the embodiment shown in FIG. 8.

Referring to FIG. 15, it can be seen that the signal NAND_2 is passed to output buffer 116, comprising inverters 158 (also labelled INV5) and 160 (also labelled INV6). Note that once the signal NAND_2 goes high the killing stage 102 of the edge generation circuitry 30 is then also disabled (locked in a steady state) meaning that the complete edge detector circuitry 30 is then disabled, and can only be reset by a power reset. The high value of the output signal KILL_MEM then drives the latch circuitry 32 to enter its killing (disabled) state as described above.

Figure 16:
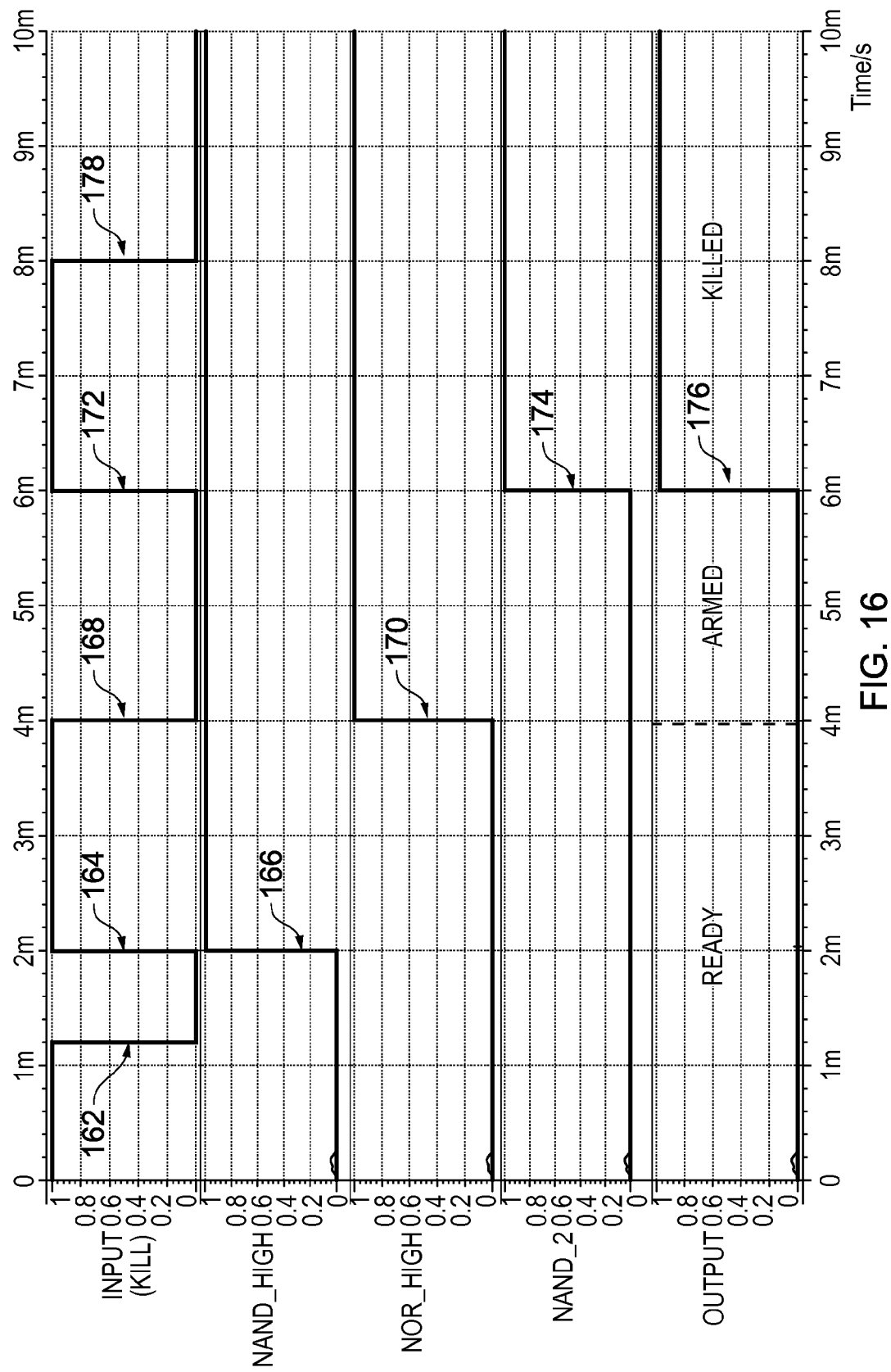
FIG. 16 shows a simulation of the switching behaviour of the embodiment shown in FIG. 8.

FIG. 16 shows a simulation of the global behaviour of the memory detection device shown in FIG. 3. After the memory protection device has been reset after a power up, a first falling edge 162 on the input signal (KILL/IN) has no effect. However, the first rising edge 164 seen on the input causes a rising transition 166 of the NAND_HIGH signal generated by the one-time rising edge detection circuitry 108. NAND_HIGH thereafter remains high. Following this, when the next falling edge 168 is seen on the input signal, this causes a rising transition 170 of the NOR_HIGH signal generated by the one-time falling edge detection circuitry 110 and the inverter 118 to occur. NOR_HIGH thereafter stays high. The memory protection device is then "armed". Next, once the circuitry has been armed in this fashion, and the killing stage 102 is therefore active, a rising edge 172 of the input signal causes the output NAND_2 of the one-time rising edge detection circuitry 114 to make a rising transition 174. Thereafter NAND_2 stays high. The memory protection device then enters it "killed" state wherein the latch circuitry 32 holds a memory status value of "disabled" and the output signal (OUT) thereof (which transitions to follow NAND_2 with a rising edge 176) causes access to the memory to be prevented. Note that after the rising edge 172 of the input signal has been observed, the edge detection circuitry is disabled and thus a further falling edge 178 (and indeed any further transitions of the input signal before a power reset has been performed) have no effect on the output signal and the memory protection device remains locked in its killed state.

Figure 17:
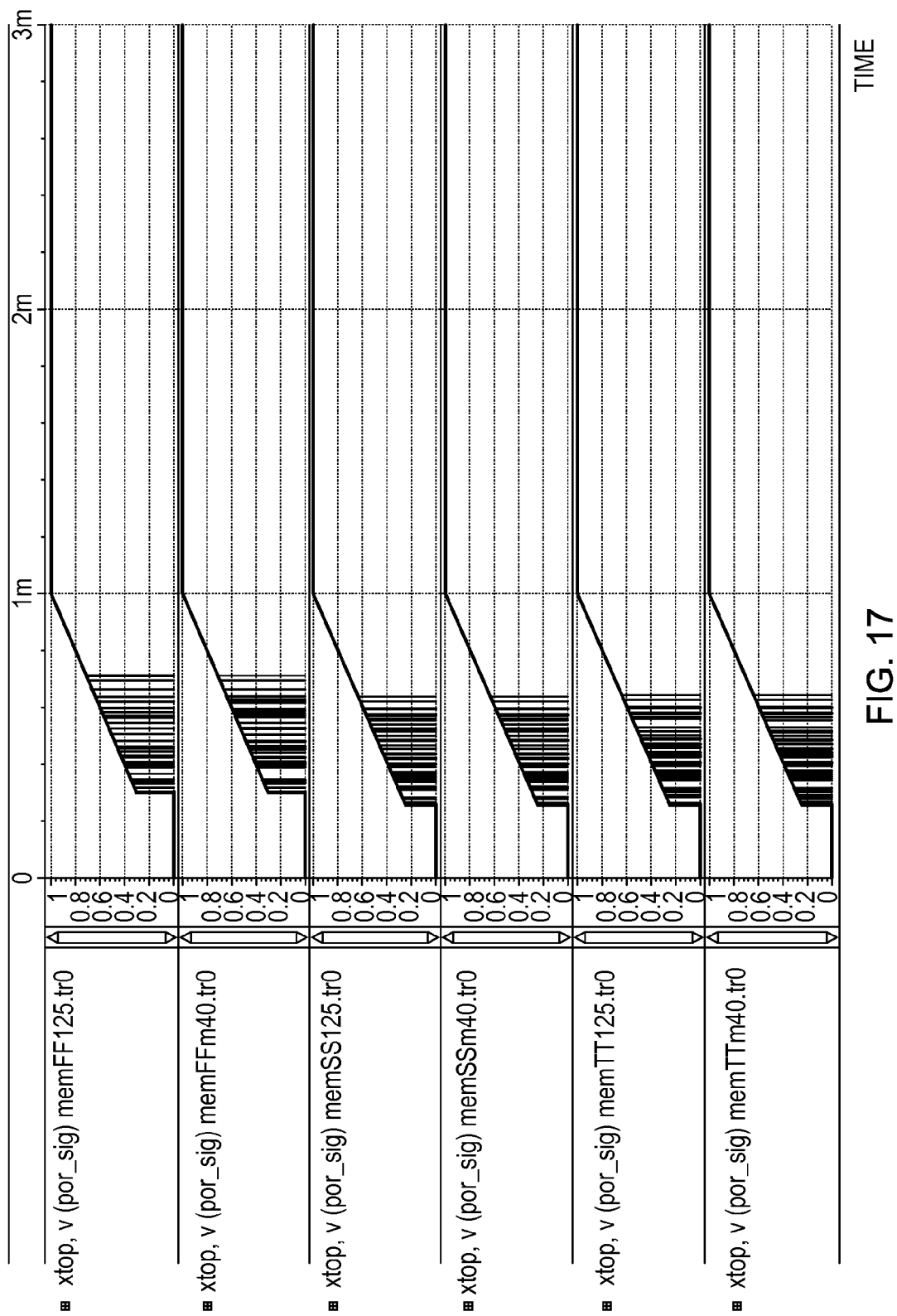
FIG. 17 illustrates a Monte Carlo simulation of the generation of the POR signal by the embodiment shown in FIG. 8 for various process corners.

The design described herein for the memory protection device has been studied under different corner cases, including process variations TT (typical-typical), FF (fast-fast) and SS (slow-slow). These process variations have further been studied at simulated temperatures ranging from −40° C. to 125° C., which covers the normal specifications of such memory devices (for example as provided by ARM Limited of Cambridge UK). FIG. 17 represents the results of 1000 different Monte Carlo runs simulating these different corner cases of the POR signal described above. The ramp represents the VDD ramping up during start up. Notice that all simulations (i.e. Monte Carlo runs), regardless of the particular process variation or the particular temperature selected, stay low (0) for a certain period and then cleanly and directly go high (follow VDD). The reliability of the generation of this POR signal thus ensures the reliable initial configuration of the memory protection device after start up and thus its correct operation to ensure protection of access to the memory as described above.

Figure 18:
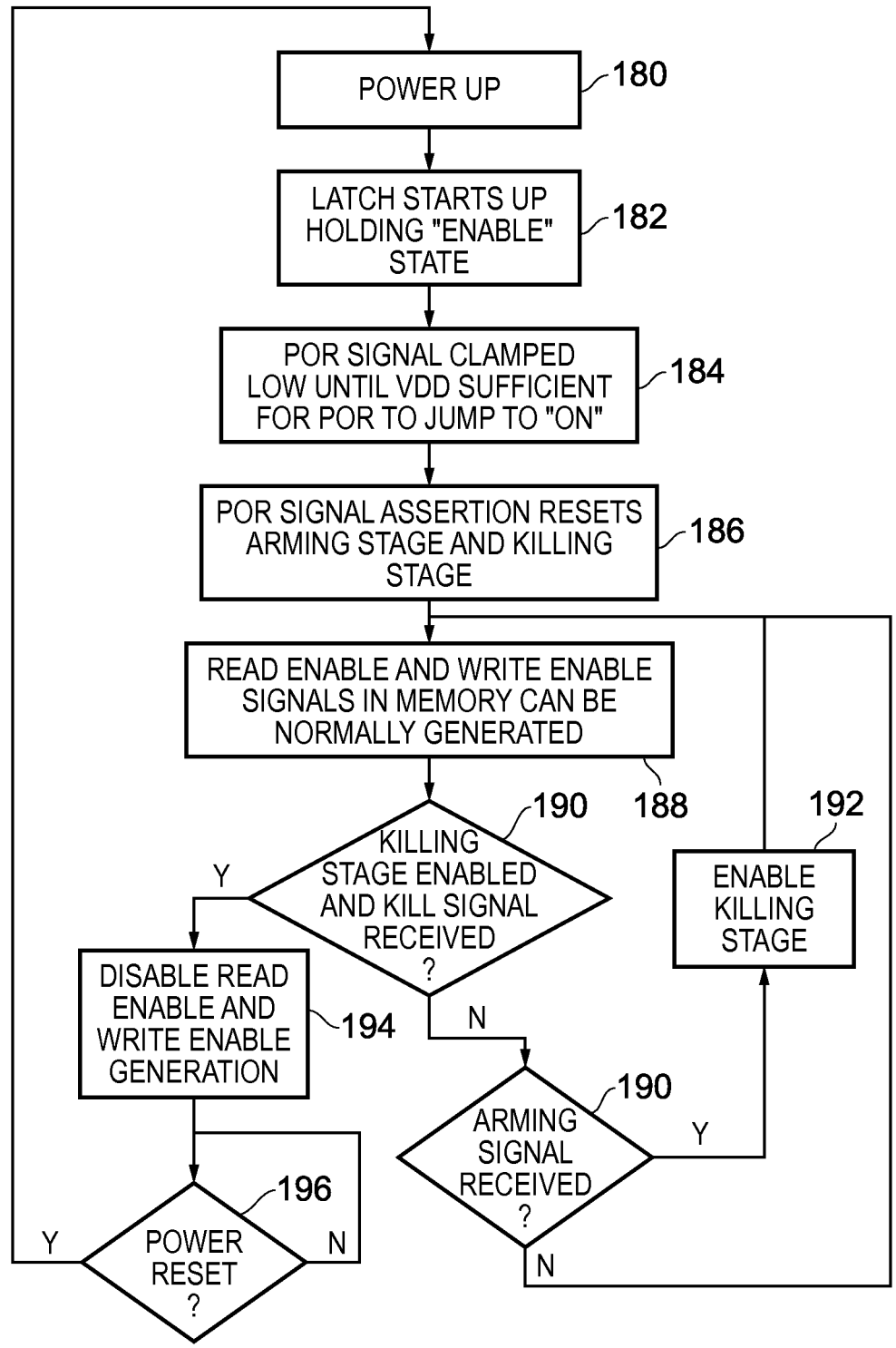
FIG. 18 schematically illustrates a sequence of steps which are taken in a memory protection device in one embodiment.

FIG. 18 schematically represents a sequence of steps which are taken by the memory protection device in one embodiment. The flow can be considered to begin at step 180 where a power up sequence begins. Due to the configuration described above, the latch circuitry 32 starts up holding the "enabled" state for the memory (step 182). Next at step 184, and as VDD ramps up, the POR signal is clamped low until VDD has reached a sufficient value for the POR signal to jump to "ON", i.e. a high value matching VDD. Once POR is asserted in this manner, at step 186, the arming stage 100 and killing stage 102 of the edge detection circuitry 30 are reset to their correct initial "ready" configuration.

Normal operation of the memory then follows at step 188 where the read enable and write enable signals in the memory can be normally generated and hence normal access to the content of memory is allowed. Next at step 190 it is determined if the killing stage is enabled and the kill signal has been received. At a first iteration this will not be the case, and the flow proceeds to step 190. At step 190 it is determined if the arming signal has yet been received (i.e. a rising following by a falling edge on the input signal). Whilst this is not the case the flow loops back to step 188 for normal memory access to continue. Once the arming signal has been received then the flow proceeds from step 190 to step 192 where the killing stage 102 is enabled and the flow returns to step 188 for normal memory access to continue. When, at step 190 it is determined that the killing stage is enabled and the kill signal has been received (i.e. a rising edge on the input signal) the flow proceeds to step 194 where the read enable and write enable generation of the memory are disabled. The flow then proceeds to step 196, where a power reset is waited for, whereafter the flow returns to step 180. It is to be noted that in the waiting state represented by the loop which feeds back on itself at step 196, then memory appears in many regards to operate normally to an outside observer (e.g. the signals clock enable (CN), clock (CLK), global write enable (GWEN) and so on are unaffected). However, the disabling of the read enable and write enable signals mean that no read out from or writing to the bit cells of the memory is possible.

Although particular embodiments of the invention have been described herein, it will be apparent that the invention is not limited thereto, and that many modifications and additions may be made within the scope of the invention.

For example, various combinations of the features of the following dependent claims could be made with the features of the independent claims without departing from the scope of the present invention.

We claim:

1. A memory protection device for controlling access to a memory comprising:
    latch circuitry configured to hold a memory status value, the memory status value indicative of whether the memory is in an enabled state or in a disabled state, wherein the latch circuitry is configured to be reset on power-up when a power-on-reset signal is asserted and is configured such that, following the reset of the latch circuitry, the memory status value indicates the enabled state;
    control circuitry configured, in response to assertion of a received control signal, to assert a memory kill signal, wherein the latch circuitry is configured to switch the memory status value to indicate the disabled state in response to assertion of the memory kill signal and the latch circuitry is configured such that after the memory status value is switched to indicate the disabled state the memory status value cannot be changed to the enabled state without power resetting the memory protection device, and wherein after power resetting the power-on-reset signal is asserted; and
    disabling circuitry coupled to enable signal circuitry of the memory and configured such that an enable signal provided by the enable signal circuitry can only be provided in a disabled state when the memory status value held by the control circuitry is in the disabled state.

2. The memory protection device as claimed in claim 1, wherein the enable signal circuitry is configured to provide a read enable signal and a write enable signal to the memory and the disabling circuitry is configured such that the read enable signal and the write enable signal provided by the enable signal circuitry can only be provided in a disabled state when the memory status value held by the control circuitry is in the disabled state.

3. The memory protection device as claimed in claim 1, wherein the enable signal circuitry is configured to provide a clock enable signal to the memory and the disabling circuitry is configured such that the clock enable signal provided by the enable signal circuitry can only be provided in a disabled state when the memory status value held by the control circuitry is in the disabled state.

4. The memory protection device as claimed in claim 1, further comprising power-on-reset circuitry configured to generate the power-on-reset signal when the memory protection device powers up.

5. The memory protection device as claimed in claim 4, wherein the power-on-reset circuitry comprises a voltage divider arranged between a power voltage supply and a ground voltage supply, the voltage divider comprising two self-coupled transistors forming diodes and further comprises a feedback path coupling the power-on-reset signal to a gate of a transistor on a ground supply side of the voltage divider, such that as the power voltage supply rises when the memory protection device powers up the power-on-reset signal is held not-asserted until the power supply voltage reaches a predetermined voltage level and thereafter the power-on-reset signal is held asserted.

6. The memory protection device as claimed in claim 2, wherein the disabling circuitry comprises a first transistor configured to couple an output of the read enable signal to a predetermined voltage in response to assertion of the memory kill signal, and a second transistor configured to couple an output of the write enable signal to the predetermined voltage when the memory status value held by the control circuitry is in the disabled state.

7. The memory protection device as claimed in claim 3, wherein the disabling circuitry comprises a transistor configured to couple an output of the clock enable signal to a predetermined voltage when the memory status value held by the control circuitry is in the disabled state.

8. The memory protection device as claimed in claim 1, wherein the latch circuitry comprises a pair of cross-coupled inverters.

9. The memory protection device as claimed in claim 8, wherein each inverter of the pair of cross-coupled inverters comprises a PMOS transistor and an NMOS transistor, wherein in one inverter the PMOS transistor is smaller than the NMOS transistor, whilst in the other inverter the PMOS transistor is larger than the NMOS transistor, such that after power resetting the memory status value indicates the enabled state.

10. The memory protection device as claimed in claim 8, wherein the memory status value is held at a first connection point between the pair of inverters and an inverse value of the memory status value is held at a second connection point between the pair of inverters, and the latch circuitry is configured to set the memory status value and the inverse value by selective coupling of the memory kill signal and the power-on-reset signal to the first and second connection points,
    wherein the memory kill signal is arranged to selectively couple a first voltage supply to the first connection point and to selectively couple a second voltage supply to the second connection point, and the power-on-reset signal is arranged to selectively couple the second voltage supply to the first connection point and to selectively couple the first supply voltage to the second connection point, wherein the first voltage supply provides a first voltage which represents one of a logical high and a logical low in the memory protection device and the second voltage supply provides a second voltage which represents the other of the logical high and the logical low not represented by the first voltage.

11. The memory protection device as claimed in claim 1, wherein the control circuitry comprises an arming stage and a killing stage, wherein the received control signal comprises an arming control signal followed by a killing control signal, and wherein the arming stage is configured to generate an armed signal in response to the arming control signal, the killing stage configured to be inactive until the armed signal is generated, and the killing stage is configured to generate the memory kill signal when the armed signal is asserted and the killing control signal is received.

12. The memory protection device as claimed in claim 1, wherein the control circuitry is configured such that after the memory kill signal is generated the control circuitry is disabled and is only enabled again after power-up.

13. The memory protection device as claimed in claim 11, wherein the control circuitry comprises edge detection circuitry, the edge detection circuitry configured to identify the arming control signal from a first type of edge of the received control signal followed by a second type of edge of the received control signal, and the edge detection circuitry is configured to identify the killing control signal from a further type of edge of the received control signal, wherein the first type of edge, the second type of edge, and the further type of edge are selected from: a rising edge and a falling edge, and the first type of edge and second type of edge differ from one another.

14. The memory protection device as claimed in claim 13, wherein the edge detection circuitry comprises pulse generation circuitry configured to generate a pulse signal in response to an edge of the received control signal, wherein the pulse generation circuitry comprises delaying circuitry configured to generate a delayed version of the received control signal as part of generating the pulse signal.

15. The memory protection device as claimed in claim 14, wherein the delaying circuitry comprises at least one inverter, wherein a PMOS diode is interposed on a supply voltage connection of the at least one inverter.

16. The memory protection device as claimed in claim 11, wherein the control circuitry comprises at least one reset transistor configured to set at least one internal value of the control circuitry on power up, wherein setting of the at least one internal value by the at least one reset transistor is enabled by assertion of the power-on-reset signal.

17. The memory protection device as claimed in claim 13, wherein the armed signal is set to a non-asserted state by a predetermined reset transistor in response to assertion of the power-on-reset signal.

18. A memory protection device for controlling access to a memory comprising:
    means for holding a memory status value, the memory status value indicative of whether the memory is in an enabled state or in a disabled state, and resetting the memory status value on power-up when a power-on-reset signal is asserted such that the memory status value indicates the enabled state;
    means for asserting a memory kill signal in response to assertion of a received control signal;
    means for switching the memory status value to indicate the disabled state in response to assertion of the memory kill signal, wherein after the memory status value is switched to indicate the disabled state the memory status value cannot be changed to the enabled state without power resetting the memory protection device, and wherein after power resetting the power-on-reset signal is asserted; and
    means for forcing an enable signal provided by enable signal circuitry of the memory to be provided in a disabled state when the memory status value held is asserted.

19. A method of controlling access to a memory with a memory protection device comprising the steps of:
    holding a memory status value, the memory status value indicative of whether the memory is in an enabled state or in a disabled state, and resetting the memory status value on power-up when a power-on-reset signal is asserted such that the memory status value indicates the enabled state;
    asserting a memory kill signal in response to assertion of a received control signal;
    switching the memory status value to indicate the disabled state in response to assertion of the memory kill signal, wherein after the memory status value is switched to indicate the disabled state the memory status value cannot be changed to the enabled state without power resetting the memory protection device, and wherein after power resetting the power-on-reset signal is asserted; and
    forcing an enable signal provided by enable signal circuitry of the memory to be provided in a disabled state when the memory status value held is asserted.

* * * * *